United States Patent
Eliezer et al.

(10) Patent No.: US 7,460,612 B2
(45) Date of Patent: Dec. 2, 2008

(54) METHOD AND APPARATUS FOR A FULLY DIGITAL QUADRATURE MODULATOR

(75) Inventors: Oren E. Eliezer, Plano, TX (US); Francis P. Cruise, Dallas, TX (US); Robert B. Staszewski, Garland, TX (US); Jaimin Mehta, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 384 days.

(21) Appl. No.: 11/203,504

(22) Filed: Aug. 11, 2005

(65) Prior Publication Data

US 2006/0291589 A1 Dec. 28, 2006

Related U.S. Application Data

(60) Provisional application No. 60/601,587, filed on Aug. 12, 2004.

(51) Int. Cl.
*H04L 27/00* (2006.01)

(52) U.S. Cl. .................. 375/295; 375/261; 375/298; 332/103; 332/104; 332/105

(58) Field of Classification Search ............. 375/261, 375/295, 298; 332/103–105
See application file for complete search history.

(56) References Cited

U.S. PATENT DOCUMENTS

| 4,794,621 | A | 12/1988 | Dirr |
| 5,561,401 | A | 10/1996 | Mineo |
| 6,114,921 | A | 9/2000 | Aoki |
| 2002/0051497 | A1* | 5/2002 | Breems et al. ............. 375/261 |
| 2003/0011861 | A1 | 1/2003 | Casagrande |
| 2003/0016762 | A1 | 1/2003 | Martin et al. |
| 2004/0263273 | A1* | 12/2004 | Ahmed ..................... 332/103 |

OTHER PUBLICATIONS

B. Schafferer, R. Adams, "A 3V CMOS 400mW 14b 1.4GS/s DAC for Multi-Carrier Applications", 2004 IEEE International Solid-State Circuits Conference, Section 20.1.
P. Eloranta, P. Seppinen, Direct-Digital RF Modulator IC in 0.13µm CMOS for Wide-Band Multi-Radio Applications, 2005 IEEE International Solid-State Circuits Conference, Section 29.2.
V.W. Leung, L.E. Larson, P.S. Gudem, "Improved Digital-IF Transmitter Architecture for Highly Integrated W-CDMA Mobile Terminals", IEEE Trans. on Vehicular Tech., vol. 54, No. 1, Jan. 2005, pp. 20-32.
S. Luschas, R. Schreier, H.S. Lee, "Radio Frequency Digital-to-Analog Converter", IEEE J. of Solid-State Circuits, vol. 39, No. 9, Sep. 2004, pp. 1462-1467.
J. Vankka, J. Sommarek, J. Ketola, I. Teikari, K.A.I. Halonen, "A Digital Quadrature Modulator With On-Chip D/A Converter", IEEE J. of Solid-State Circuits, vol. 38, No. 10, Oct. 2003, pp. 1635-1638.

* cited by examiner

*Primary Examiner*—Curtis B Odom
(74) *Attorney, Agent, or Firm*—Ronald O. Neerings; Wade James Brady, III; Frederick J. Telecky, Jr.

(57) ABSTRACT

A novel apparatus and method for a fully digital quadrature architecture for a complex modulator. The complex modulator can substitute for existing prior art analog quadrature modulator structures and those based on a digital polar architecture $(r, \theta)$. The modulator effectively operates as a complex digital-to-analog converter where the digital inputs are given in Cartesian form, namely I and Q representing the complex number I+jQ, while the output is a modulated RF signal having a corresponding amplitude and phase shift. The phase shift being with respect to a reference phase dictated by the local oscillator, which is also input to the converter/modulator. Several embodiments are provided including modulators incorporating dual I and Q transistor arrays, a single shared I/Q transistor array, modulators with single ended and differential outputs and modulators with single and dual polarity clock and I/Q data signals.

38 Claims, 16 Drawing Sheets

METHOD AND APPARATUS FOR A FULLY DIGITAL QUADRATURE MODULATOR

REFERENCE TO RELATED APPLICATION

This application claims priority to U.S. Provisional Application Ser. No. 60/601,587, filed Aug. 12, 2004, entitled "Method and Apparatus for a Fully Digital RF Transmitter", incorporated herein by reference in its entirety.

FIELD OF THE INVENTION

The present invention relates to the field of data communications and more particularly relates to a method and apparatus for an RF transmitter incorporating a fully digital quadrature modulator.

BACKGROUND OF THE INVENTION

The cellular phone industry continues to thrive by providing support for Bluetooth personal area networking, positioning technology based on GPS and wireless LAN for high-speed local-area data access. Sophisticated applications, such as MP3 audio playback, camera functions, MPEG video and digital TV further entice a new wave of handset replacements. Such application support dictates a high level of memory integration together with large digital signal processing horsepower and information flow management, all requiring sophisticated DSP and microprocessor cores. To keep cost and power dissipation down, as well as to constrain growth of printed circuit board (PCB) real estate, the entire radio, including memory, application processor (AP), digital baseband (DBB) processor, analog baseband and RF circuits would ideally be all integrated onto a single silicon die with a minimal number of external components.

Currently, the DBB and AP designs invariably migrate to the most advanced deep-submicron digital CMOS process available, which usually does not offer any analog extensions and has very limited voltage headroom. Design flow and circuit techniques of contemporary transceivers for multi-GHz cellular applications are typically analog intensive and utilize process technologies that are incompatible with DBB and AP processors. The use of low-voltage deep-submicron CMOS processes allows for an unprecedented degree of scaling and integration in digital circuitry, but complicates implementation of traditional RF circuits. Furthermore, any mask adders for RF/analog circuits are not acceptable from fabrication cost standpoint. Consequently, a strong incentive has arisen to find digital architectural solutions to the RF functions. One approach to reduce the cost, area and power consumption of the complete mobile handset solutions is through integration of the conventional RF functions with the DBB and AP.

Quadrature modulators are in widespread use today. A block diagram illustrating a prior art Cartesian architecture with I and Q baseband signals is shown in FIG. 1. The modulator, generally referenced 10, comprises a coder 12, I and Q TX pulse-shaping filters 14, 16, cos and sin multipliers of a local oscillator clock 18, 20 and adder 22. In operation, the input bit stream $b_k$ is converted by the coder to I (real) and Q (imaginary) symbols. These are pulse-shaped and the resulting baseband signals are multiplied by the cos and sin signals of the local oscillator to generate in-phase and quadrature phase components, respectively. These are combined to generate the output RF signal x(t). Note that this Cartesian modulation scheme could be implemented digitally, which is desirable considering the benefits of digital implementation of circuitry which is typically implemented in analog.

Complex modulation may also be generated using a polar modulation scheme to substitute for the quadrature modulation of FIG. 1. A circuit diagram illustrating prior art polar complex modulation based on direct phase and amplitude modulation is shown in FIG. 2. The circuit, generally referenced 30, comprises a coder 32, I and Q TX filters 34, 36, polar coordinate converter 38, local oscillator 40 and multiplier 42.

In operation, the bits $b_k$ to be transmitted are input to the coder, which functions to generate I (real) and Q (imaginary) symbols therefrom according to the targeted communications standard. The I and Q symbols are pulse-shaped and the resulting baseband signals are converted to phase (Ang{s(t)}), and magnitude (Mag{s(t)}) baseband signals by the polar coordinate converter 38, typically implemented using what is known as a COordinate Rotation DIgital Computer (CORDIC). This block performs the conversion from Cartesian to polar coordinates of amplitude $A=\sqrt{I^2+Q^2}$ and phase $$\varphi = \arctan\frac{Q}{I}.$$

The phase data is used to phase modulate the local oscillator 40 to generate the appropriate constant-envelope frequency modulated signal $\cos(\omega_c t+\phi(t))$, which is effectively multiplied in multiplier/mixer 42 by the magnitude data resulting in the output modulated RF signal denoted by $x(t)=A(t)\cos(\omega_c t+\phi(t))$.

Note that this polar modulation scheme is well suited for digital implementation. A problem arises, however, in that the amplitude and phase modulation paths have entirely different modulators and these two paths must be well aligned in their timing. Even slight misalignment could result in intolerable distortion of the output modulated RF signal.

Considering an all-digital implementation, the local oscillator 40 can be made extremely accurate. By nature, the polar architecture natively operates in the frequency domain where the frequency is the derivative of the phase with respect to time. Depending on the type of modulation implemented, the change in frequency $\Delta f$ from one command cycle to another can be very large for sudden phase reversals that occur near the origin in the I/Q domain representing the complex envelope.

The conventional Cartesian modulator, on the other hand, operates natively in the phase domain and avoids handling the large swings in frequency. A disadvantage of this scheme, however, is in its difficulty to achieve high resolution compared to the polar scheme. Additionally, amplitude and phase mismatches of the I and Q paths result in modulation distortion.

The prior art analog quadrature Cartesian modulator structure has several disadvantages. Analog Cartesian modulators (1) require analog intensive compensation mechanisms to minimize the impact of modulator impairments, such as I/Q gain imbalance and phase orthogonality error, (2) may require a surface acoustic wave (SAW) filter in the transmit path, which adds considerable cost and silicon area, to reduce noise levels of traditional analog circuitry, (3) make adaptation difficult to different radio standards due to the analog nature of the modulator.

Prior art polar architectures also have several disadvantages, including (1) requiring wideband frequency modulation of the all digital phase locked loop (ADPLL), thereby complicating the varactor banks and associated control circuitry required by such architectures, (2) requiring a calibration procedure to determine and normalize the gain of the digitally controlled oscillator (DCO), whose accuracy is crucial and somewhat problematic in wideband modulation, (3) requiring accurate and problematic time-alignment tuning between the amplitude and phase modulating signals, in particular when the amplitude modulation is analog, (4) requiring a high-speed COordinate Rotation DIgital Computer (CORDIC) mechanism used to convert from Cartesian to polar, (5) having wider spectral replicas where the bandwidth of the spectral replicas is equivalent to that of the envelope signal rather than to the narrower bandwidth of the quadrature components I and Q, and (6) limited capability for carrier leakage cancellation.

Thus, there is a need for a modulation scheme that (1) is fully digital, (2) able to generate complex I and Q modulation at RF frequencies, (3) avoids the disadvantages of prior art analog Cartesian and polar modulation schemes, (4) is well suited for implementation in deep submicron CMOS processes, and (5) is able to address any desired modulation scheme including WCDMA and other advanced modulation schemes.

SUMMARY OF THE INVENTION

The present invention provides a solution to the problems of the prior art by providing a method and apparatus for an RF transmitter incorporating a fully digital mechanism for complex RF modulation. A key benefit of the digital quadrature modulator of the present invention is the ability to address virtually all possible modulation schemes. The invention is particularly applicable and well suited for a single chip CMOS based software defined radio (SDR). An SDR based on the complex modulator of the present invention is capable of switching between multiple radio standards based on a software-controlled configuration with the added benefit of maximal reuse of hardware.

The present invention provides a fully digital Cartesian (I, Q) architecture for a complex modulator. This complex modulator can substitute for existing prior art analog quadrature modulator structures of the type shown in FIG. 1. Further, the complex modulator can also substitute for existing prior art modulators based on a digital polar architecture (r, θ) of the type shown in FIG. 2.

The complex modulator of the present invention can be implemented using numerous digital technologies. It is particularly well suited for use with deep sub-micron CMOS fabrication processes where an entire transceiver based on the complex modulator can be integrated on chip along with a digital processor. One example application is a single-chip multi-mode smart-phone or other wireless handheld device, e.g., cell phone, etc.

The present invention may be regarded as a complex digital-to-analog converter where the digital inputs are given in Cartesian form (i.e. I and Q representing the complex number I+jQ) and the output is an RF signal having a corresponding amplitude and phase shift. The phase shift being with respect to a reference phase dictated by the local oscillator, which is also input to the converter/modulator.

Various embodiments are described including those having dual I and Q transistor arrays, single ended and differential outputs, and single and dual polarities. Both positive and negative values of I and Q are supported. For a single polarity (i.e. single-ended structure), negative values of I and Q are effectively generated by phase shifting the I or Q value 180 degrees. This is realized by inverting the phase of the switching signal of the transistors such that they would be turned on during the negative portion rather than the positive portion of the RF cycle.

In the context of the traditional analog quadrature architectures such as described supra, the digital Cartesian structure of the present invention provides several advantages over prior art modulators based on traditional analog quadrature architectures. First, the digital complex modulator eliminates the need for analog intensive compensation mechanisms that are used to minimize the impact of modulator impairments, such as I/Q gain imbalance and phase orthogonality error. Second, the digital complex modulator eliminates the need for a surface acoustic wave (SAW) filter in the transmit path by providing lower noise levels than those achievable by analog solutions based on the same technology, due to the use of switched transistors in place of linear circuitry. The higher noise levels of traditional analog circuitry typically result in a need for a SAW filter in the transmit path, which adds considerable cost and area to the transceiver. Third, the digital nature of the modulating signals allows for relatively simple adaptation of the digital complex modulator to multiple radio standards through the use of configurable filtering and sampling rates for the I and Q signals, since the modulation is not dependent upon frequency modulation limitations and analog circuitry is minimized.

In the context of the traditional digital polar architectures such as those described supra, the digital Cartesian structure of the present invention offers several advantages over traditional polar architectures. First, the complex modulator eliminates the need for wideband frequency modulation that is required of the all-digital-phase-locked-loop (ADPLL) used in prior art architectures, thereby simplifying and reducing the varactor banks and associated control circuitry required by such architectures. Second, the complex modulator eliminates the need for a very accurate calibration procedure typically used to determine and normalize the gain of the digitally controlled oscillator (DCO), whose accuracy is crucial and somewhat problematic in wideband modulation.

Third, the complex modulator eliminates the need for accurate and problematic time-alignment tuning between the amplitude and phase modulating signals, which varies from one standard to another, as the filtering of the envelope signal may vary. Fourth, the complex modulator eliminates the need for a high-speed COordinate Rotation DIgital Computer (CORDIC) mechanism used to convert from Cartesian to polar and filtering/interpolation that follow it as well, which creates non-linear distortion. Note that in a polar architecture, such a converter is needed since the complex envelope is always initially generated in Cartesian coordinates {I, Q} in accordance with the defined pulse shaping associated with the particular standard being implemented. The high sampling rate in the CORDIC is typically needed due to the artificial bandwidth expansion caused by the non-linear transformations preformed within the CORDIC to convert from the Cartesian to the polar coordinates. The amplitude expressed by $$A = \sqrt{I^2 + Q^2} \qquad (1)$$

and the phase expressed by $$\varphi = \arctan \frac{Q}{I} \qquad (2)$$

Fifth, the complex modulator offers spectral relief at far-out frequencies since, as a discrete-time system having spectral replicas at integer multiples of the sampling frequency, it minimizes the bandwidth of the spectral replicas to that of the fundamental signal. This is in contrast with the wider spectral replicas suffered in the prior art polar architecture, where the bandwidth of the spectral replicas is equivalent to that of the envelope signal.

Note that many aspects of the invention described herein may be constructed as software objects that are executed in embedded devices as firmware, software objects that are executed as part of a software application on either an embedded or non-embedded computer system such as a digital signal processor (DSP), microcomputer, minicomputer, microprocessor, etc. running a real-time operating system such as WinCE, Symbian, OSE, Embedded LINUX, etc. or non-real time operating system such as Windows, UNIX, LINUX, etc., or as soft core realized HDL circuits embodied in an Application Specific Integrated Circuit (ASIC) or Field Programmable Gate Array (FPGA), or as functionally equivalent discrete hardware components.

There is therefore provided in accordance with the present invention, a digital complex modulator, comprising a first parallel array of switches adapted to be clocked by an I local oscillator clock signal gated with an I digital control word to generate a first current therefrom substantially proportional to said I digital control word, a second parallel array of switches adapted to be clocked by a Q local oscillator clock signal gated with a Q digital control word to generate a second current therefrom substantially proportional to said Q digital control word, and means for summing said first current and said second current to yield a complex modulated output signal.

There is also provided in accordance with the present invention, a method of digital I/Q complex modulation, said method comprising the steps of providing an I switch array adapted to generate a first signal proportional to the number of switches active within said I switch array, providing a Q switch array adapted to generate a second signal proportional to the number of switches active within said Q switch array, applying a first gated combination of an I local oscillator clock signal and an I digital control word to said I switch array whereby the number of switches active in said I switch array is determined by said I control word, applying a second gated combination of a Q local oscillator clock signal and a Q digital control word to said Q switch array whereby the number of switches active in said Q switch array is determined by said Q control word, and summing said first signal and said second signal to yield a complex modulated output signal therefrom.

There is further provided in accordance with the present invention, a digital quadrature modulator, comprising a local oscillator operative to generate quadrature phases, a switch array comprising a plurality of switches adapted to generate a complex modulated output signal substantially proportional to the number of switches active at any one time in said array, a switch matrix adapted to couple said quadrature phases output of said local oscillator to said transistor array, and control means coupled to said switch array, said control means operative to dynamically allocate a first portion of said switches to I output and a second portion to Q output based on values of I and Q input signals.

There is also provided in accordance with the present invention, a digital quadrature modulator, comprising oscillator means for generating a local oscillator I ($LO_I$) signal, an inverted $\overline{LO_I}$ signal, a $LO_Q$ signal, and an inverted $\overline{LO_Q}$ signal, an I switch array comprising a plurality of first switches adapted to generate an I output signal substantially proportional to a number of first switches active at any one time, wherein the number of first switches active in synchronization with the $LO_I$ or $\overline{LO_I}$ signal is determined by a magnitude of an I digital input signal, a Q switch array comprising a plurality of second switches adapted to generate a Q output signal substantially proportional to the number of second switches active at any one time, wherein the number of second switches active in synchronization with the $LO_Q$ or $\overline{LO_Q}$ signal is determined by a magnitude of a Q digital input signal, first means adapted to couple either said $LO_I$ signal or said $\overline{LO_I}$ signal to said I switch array in accordance with a sign of said I input signal, second means adapted to couple either said $LO_Q$ signal or said $\overline{LO_Q}$ signal to said Q switch array in accordance with a sign of said Q input signal, and means for summing said I output signal and said Q output signal to generate a quadrature modulated output therefrom.

There is further provided in accordance with the present invention, a digital quadrature modulator, comprising oscillator means for generating a first local oscillator signal $LO_I$, a second local oscillator signal $LO'_I$, a third local oscillator signal $LO_Q$, and fourth local oscillator signal $LO'_Q$, a switch array comprising a plurality of switches adapted to be shared between I and Q digitally control branches, said switch array operative to generate a quadrature modulated output signal substantially proportional to a number of switches instantaneously active in accordance with the combined I and Q input digital signals and said local oscillator signals, first means for generating an I contribution in accordance with an I input signal and an I local oscillator signal, second means for generating a Q contribution in accordance with an I input signal and an I local oscillator signal, and third means for time multiplexing said I contribution and said Q contribution to yield said combined I and Q signal to produce said quadrature modulated output.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout

Figure 1:
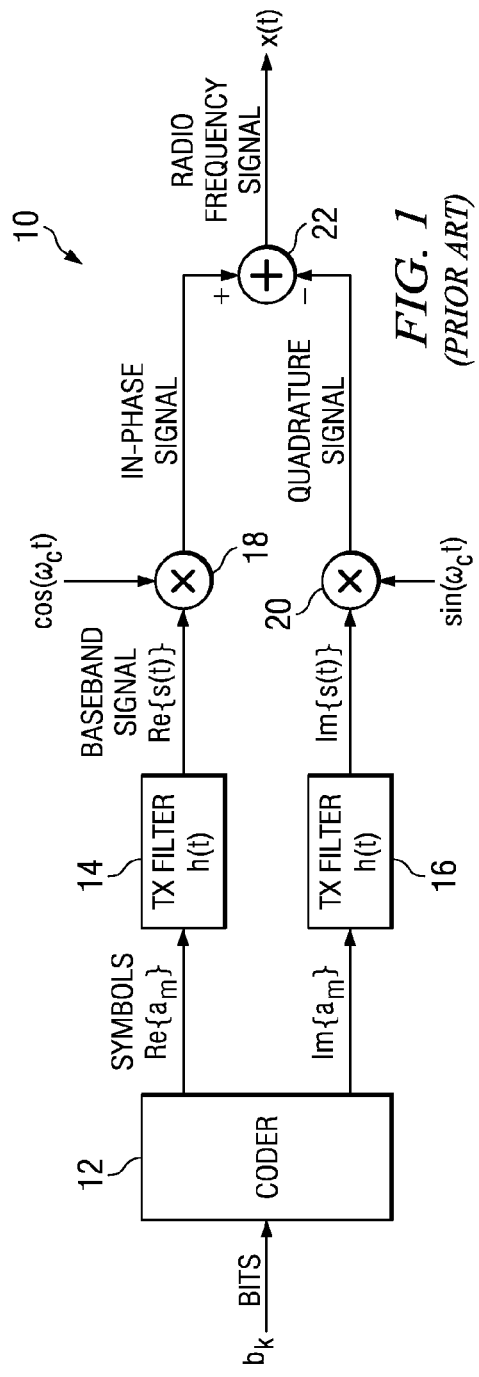
FIG. 1 is a block diagram illustrating prior art quadrature (Cartesian) architecture modulator with I and Q baseband signals.

The following notation is used throughout this document.

| Term | Definition |
|---|---|
| ACW | Amplitude Control Word |
| ADPLL | All Digital Phase Locked Loop |
| AM | Amplitude Modulation |
| AP | Application Processor |
| ASIC | Application Specific Integrated Circuit |
| CMOS | Complementary Metal Oxide Semiconductor |
| CORDIC | COordinate Rotation DIgital Computer |
| CU | Control Unit |
| DAC | Digital to Analog Converter |
| DBB | Digital Baseband |
| DC | Direct Current |
| DCO | Digital Controlled Oscillator |
| DFC | Digital to Frequency Conversion |
| DPA | Digital Power Amplifier |
| DQM | Digital Quadrature Modulator |
| DRAC | Digital to RF Amplitude Converter |
| DRP | Digital RF Processor or Digital Radio Processor |
| DSP | Digital Signal Processor |
| ECL | Emitter Coupled Logic |
| EDGE | Enhanced Data rates for Global Evolution |
| FET | Field Effect Transistor |
| FPGA | Field Programmable Gate Array |
| GPS | Global Positioning System |
| GSM | Global System for Mobile Communication |
| HDL | Hardware Description Language |
| IC | Integrated Circuit |
| LAN | Local Area Network |
| LO | Local Oscillator |

-continued

| Term | Definition |
|---|---|
| MOS | Metal Oxide Semiconductor |
| MP3 | MPEG Audio Layer 3 |
| MPEG | Moving Picture Experts Group |
| nMOS | n-channel Metal Oxide Semiconductor |
| PA | Power Amplifier |
| PCB | Printed Circuit Board |
| PLL | Phase Locked Loop |
| PM | Phase Modulation |
| pMOS | p-channel Metal Oxide Semiconductor |
| PVT | Process Voltage Temperature |
| QAM | Quadrature Amplitude Modulation |
| RF | Radio Frequency |
| RFC | RF Choke |
| SAW | Surface Acoustic Wave |
| SDR | Software Defined Radio |
| UWB | Ultra Wideband |
| VCO | Voltage Controlled Oscillator |
| WCDMA | Wideband Code Division Multiple Access |
| WLAN | Wireless Local Area Network |

Detailed Description of the Invention

The present invention is an apparatus for and a method of fully digital quadrature modulator for use in a digital RF processor (DRP). The invention is intended for use in a radio transmitter and transceiver but can be used in other applications as well, such as a general communication channel. The present invention provides a solution to the problems of the prior art by providing a modulation scheme that implements Cartesian modulation and avoids the disadvantages of prior art non-digital or semi-digital designs. The digital quadrature modulator structure is presented in the context of a direct digital-to-RF amplitude converter (DRAC), which incorporates a digital power amplifier (DPA) circuit for efficiently combining I/Q input signals, D/A conversion, filtering, buffering and RF output amplitude control into a single circuit.

To aid in understanding the principles of the present invention, the description is provided in the context of a digital to RF amplitude converter (DRAC) that serves as the final stage of an all-digital polar transmitter IC for WCDMA. It is appreciated by one skilled in the art that the fully digital quadrature modulation scheme of the present invention can be adapted to comply with numerous other wireless communications standards such as EDGE, extended data rate Bluetooth, WCDMA, Wireless LAN (WLAN), Ultra Wideband (UWB), etc. It is appreciated, however, that the invention is not limited for use with any particular communication standard (wireless or otherwise) and may be used in optical, wired and wireless applications. Further, the invention is not limited for use with a specific modulation scheme but is applicable to other complex amplitude modulation schemes as well.

The term transmit buffer is intended to include a transmit buffer as well as various amplifier circuits such as pre-power amplifier, low power amplifier, high power amplifier, etc. and it not intended to be limited by the amount of power produced.

Note that throughout this document, the term communications device is defined as any apparatus or mechanism adapted to transmit, receive or transmit and receive data through a medium. The communications device may be adapted to communicate over any suitable medium such as RF, wireless, infrared, optical, wired, microwave, etc. In the case of wireless communications, the communications device may comprise an RF transmitter, RF receiver, RF transceiver or any combination thereof.

A paradigm facing analog and RF designers of deep-submicron CMOS circuits is presented herein. In a deep-submicron CMOS process, time-domain resolution of a digital signal edge transition is superior to voltage resolution of analog signals. A successful design approach in this environment would exploit the paradigm by emphasizing (1) fast switching characteristics of MOS transistors: high-speed clocks and/or fine control of timing transitions; (2) high density of digital logic (250 kgates/mm$^2$ in this process) makes digital functions extremely inexpensive; and (3) small device geometries and precise device matching made possible by the fine lithography. While avoiding (1) biasing currents that are commonly used in analog designs; (2) reliance on voltage resolution; and (3) nonstandard devices that are not needed for memory and digital circuits.

Figure 3:
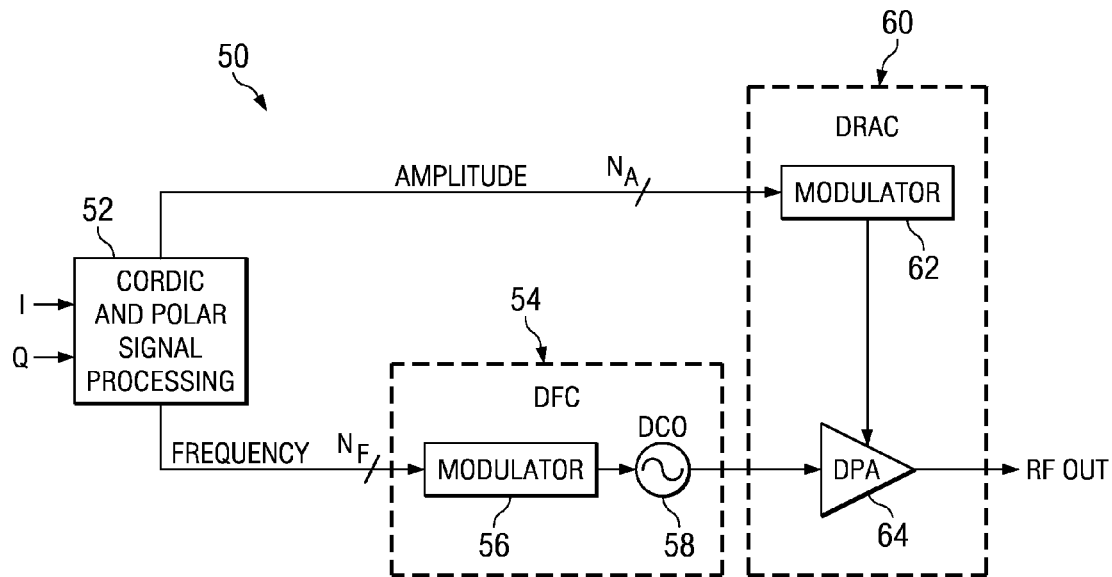
FIG. 3 is a block diagram illustrating the envelope digital modulator as part of a digital to RF amplitude converter (DRAC)

A block diagram illustrating a polar transmitter based on digitally controlled oscillator (DCO) and a digitally controlled power amplifier (DPA) circuits is shown in FIG. 3. For clarity, the all-digital PLL around the DCO is not shown. The circuit, generally referenced 50, comprises a COordinate Rotation DIgital Computer (CORDIC) and polar signal processing block 52, DRAC 60 and digital to frequency conversion (DFC) 54. The circuit 50 illustrates an application of the new paradigm to an RF wireless transmitter performing an arbitrary complex modulation. The low cost of digital logic allows for sophisticated digital signal processing. The small and well-matched devices allow for precise high-resolution conversions from digital to analog domains. The use of ultra high-speed clocks, i.e., high oversampling ratios, serves to eliminate the need for subsequent dedicated reconstruction filtering of spectral replicas and allows the use of high-rate sigma-delta dithering for resolution enhancement. Since the converters utilize DCO clocks that are of high spectral purity, the sampling jitter is very small. Due to the fine feature size and high switching speed of the modern CMOS technology employed, the respective digital-to-frequency conversion (DFC) and digital-to-RF-amplitude conversion (DRAC) transfer functions can be made very linear and of high dynamic range.

In a polar architecture, the I and Q samples of the Cartesian coordinate system generated in the digital baseband (DBB) are converted into amplitude and phase samples of the polar coordinate system using a CORDIC algorithm. The phase is then differentiated to obtain frequency deviation. The polar signals are subsequently conditioned through signal processing to sufficiently increase the sampling rate in order to reduce the quantization noise density and lessen the effects of the modulating spectrum replicas. The frequency deviation output signal is fed into the DCO-based $N_F$-bit DFC, which produces the phase modulated (PM) digital carrier:

$$y_{PM}(t) = \text{sgn}(\cos(\omega_0 t + \theta[k])) \quad (3)$$

where sgn(x)=1 for x≧0 and sgn(x)=−1 for x<0, $\omega_0 = 2\pi f_0$ is the angular RF carrier frequency and θ[k] is the modulating baseband phase of the $k^{th}$ sample. The phase $\theta(t) = \int_{-\infty}^{t} f(t) dt$ is an integral of frequency deviation, where $t = k \cdot T_0$ with $T_0$ begin the sampling period.

The amplitude modulation (AM) signal controls the envelope of the phase-modulated carrier by means of the DPA-based $N_A$-bit DRAC. Higher-order harmonics of the digital carrier are filtered out by a matching network so that the sgn( ) operator is dropped. The composite DPA output contains the desired RF output spectrum.

$$y_{RF}(t) = \alpha[k] \cdot \cos(\omega_0 t + \theta[k]) \quad (4)$$

where α[k] is the modulating baseband amplitude of the $k^{th}$ sample.

Despite their commonalities there are important differences between the two conversion functions of Equations 3 and 4. Due to the narrowband nature of the communication system, the DFC operating range is small but has a fine resolution. The DRAC operating range, on the other hand, is almost full scale, but not as precise. In addition, the phase modulating path features an additional 1/s filtering caused by the frequency-to-phase conversion of the oscillator. The signal processing and delay between the AM and PM paths should be matched, otherwise the recombined composite signal will be distorted. The matching of process, voltage and temperature (PVT) changes is guaranteed by the clock-cycle accurate characteristics of digital circuits.

The DFC and DRAC are key functions of the all-digital transmitter that do not use any current biasing or dedicated analog continuous-time filtering in the signal path. In order to improve matching, linearity, switching noise and operational speed, the operating conversion cells (bit to frequency or RF carrier amplitude) are mainly realized as unit weighted. Their architectures are presented infra.

Spectral replicas of the discrete-time modulating signal appear across the frequency axis at the DCO and DPA inputs at integer multiples of the sampling rate frequency $f_R$. They are attenuated through multiplication of the sinc$^2$ function due to the zero-order hold of the DCO/DPA input. The frequency spectrum $S_f(\omega)$) replicas are further attenuated by 6 dB/octave through the 1/s operation of the oscillator to finally appear at the RF output phase spectrum $S_\phi(\omega)$. The sampling rate of $f_R = 26$ MHz is high enough for the replicas to be sufficiently attenuated, thus making the RF signal undistinguishable from that created by conventional transmitters with continuous-time filtering at baseband. Contrarily, the spectral replicas of the amplitude modulation caused by the discrete-time nature of the digital input to the DPA circuitry are only suppressed by the zero-order hold function and therefore typically require additional treatment (e.g., digital or analog filtering) to be sufficiently suppressed to desired levels. This also applies to the spectral replicas in the case of digital quadrature modulation performed by means of a DQM of the present invention, since the DQM performs complex up-conversion whereby the baseband spectrum is shifted up to the carrier frequency. Therefore, the sampling rate must be chosen such that these spectral replicas, present at frequency distances which are integer multiples of the sampling frequency, can either be somehow filtered at the output of the DQM or do not create a problem where there may be strict spectral limitations dictated by regulations, interference considerations, etc.

Generic Modulator

The two modulators in FIG. 3 could be considered a digital front-end of a generic digital-to-analog converter (DAC), where 'analog' denotes either the frequency or RF carrier amplitude. For the reasons stated above, the cell elements of the physical converters are typically unit weighted. Consequently, the simplest realization of the modulator is a binary-to-unit-weighted converter.

Unfortunately, the above arrangement is not practical because of the limited resolution of the conversion process. For example, the 12 kHz frequency step of the DFC is not adequate for GSM modulation where the peak frequency deviation is 67.7 kHz. Likewise for the amplitude modulation, the 6-bit amplitude resolution is too coarse as well.

Figure 4:
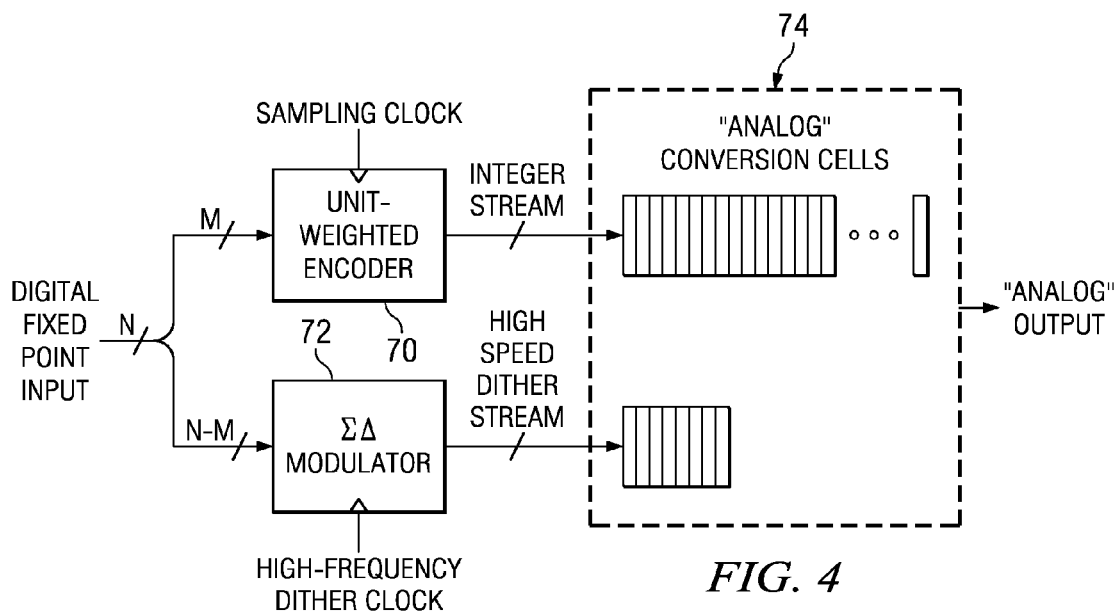
FIG. 4 is a block diagram illustrating the partition of a digital input (e.g., for I or for Q) into an integer and fractional part, wherein the fractional part is handled by a high-rate sigma-delta modulator whose output is summed with the integer part in the analog domain within the DRAC.

A block diagram illustrating the digital modulator as part of a digital to amplitude converter (DAC) is shown in FIG. 4.

In this scheme, finer conversion resolution is achieved through high-speed dithering of the finest conversion cell elements via ΣΔ modulator 72. The N-bit digital fixed-point input is split into M integer (higher-order) bits and N-M fractional (lower-order) bits. The integer word sets the number of activated conversion elements and is fed to a unit-weighted encoder 70. The fractional word is fed to a ΣΔ modulator 72 that produces a high-speed integer stream whose average value is equal to the fractional word. The integer and high-speed dither stream are fed to 'analog' conversion cells 74 (e.g., the transistors arrays, in the case of the DQM). This digital to analog conversion block 74 functions to generate the 'analog' output where the sum of the contributions of the two streams (integer and dithered-fractional) appears as an analog entity (e.g., RF current of corresponding magnitude). This principle is used in the DQM, where each of its two orthogonal branches (e.g., I and Q or I+Q and I−Q) may require separate dithering of this form, depending on the targeted resolution and the resolution limitations of the integer part.

It is noted that in this DAC architecture, the lower-rate wide-bandwidth integer stream is never merged in digital domain with the higher-rate fractional stream and the final stream addition is done in the device cell domain. In this manner, the high-speed operation is constrained to a small portion of the circuit, thus reducing current consumption. Depending on the application and the derived frequencies of operation, this summation may also take place in the digital domain and the resultant high-speed digital sum may be presented to the digital-to-analog converter circuit (e.g., transistor array).

Digitally Controlled Power Amplifier

Figure 5:
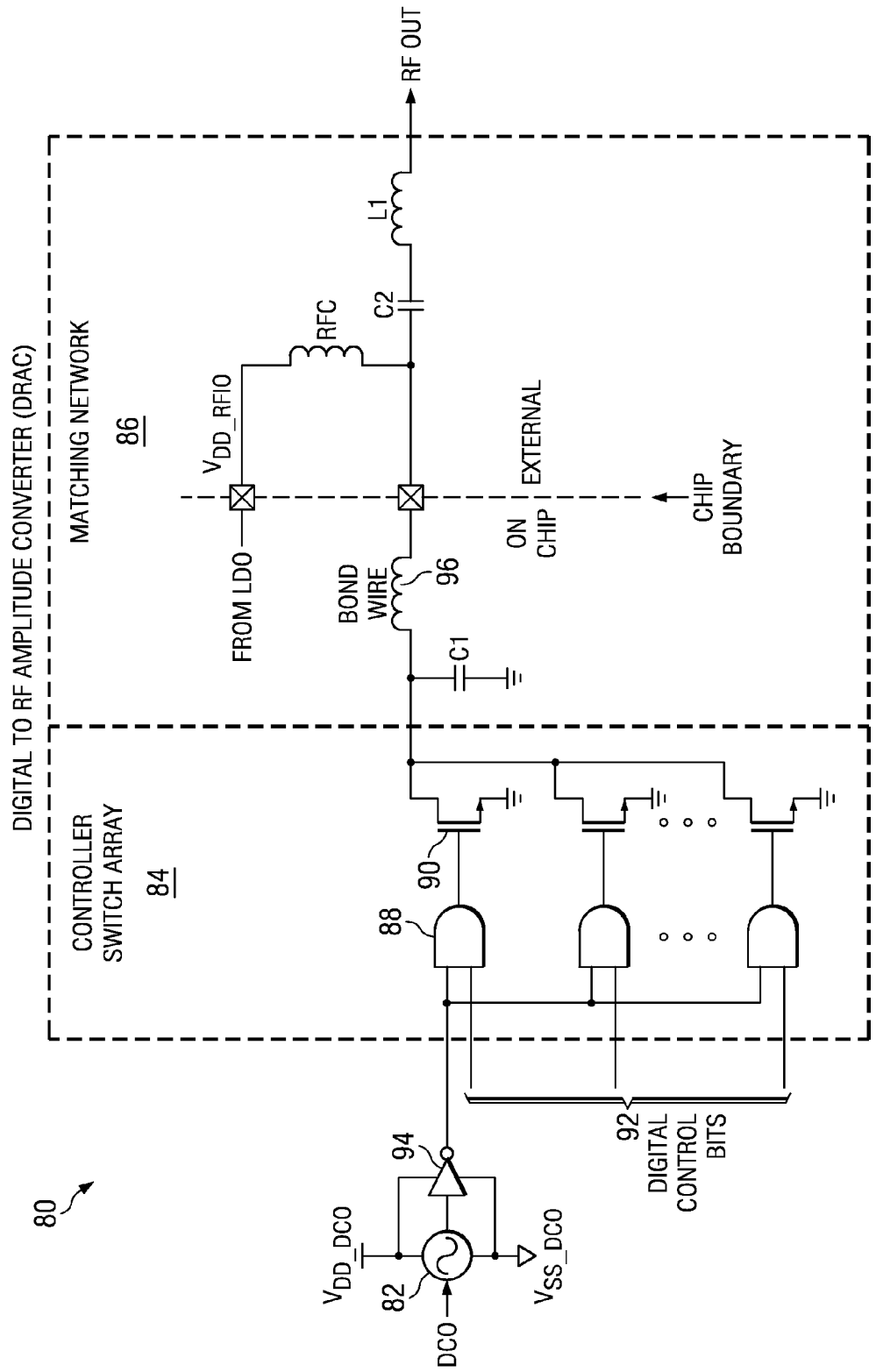
FIG. 5 is a block diagram illustrating the structure of the digitally-controlled power amplifier (DPA), which serves as a digital to RF amplitude converter (DRAC)

The DPA in the polar transmitter, which functions as a digital-to-RF-amplitude converter (DRAC), operates as a near-class E RF power amplifier and is driven by the square wave output of the DCO. A block diagram illustrating the structure of the digitally-controlled power amplifier (DPA) is shown in FIG. 5. The DRAC, generally referenced 80, comprises a plurality of N pass-gate type AND gates 88, a plurality of N output devices or switching elements 90 (nMOS devices in this example), capacitors C1, C2 and inductors 96 (bond wire), L1, RFC together forming a band-pass matching/filtering network. The DPA (or DRAC) operates as a pseudo class E type amplifier and is driven by a square wave signal output of DCO 82 and buffer 94. Being a class E buffer, no DC bias current is required by the DRAC, unlike class A, class AB, class C or class D amplifiers. The square wave signal is the phase-modulated signal from the all digital PLL (ADPLL) described supra. The N nMOS transistors 90 are used as on/off switches. An RF choke (RFC) functions as a bi-directional RF current source, connecting the nMOS switches to the on-chip supply voltage regulator ($V_{DD\_RFIO}$). The switch array is driven by a digital signal and generates an analog voltage waveform at its output.

Capacitor C1 represents the on-chip capacitance at the drain node of the nMOS transistors of the array and includes, for analysis purposes, the equivalent capacitance over one cycle given by the non-linear $C_{DD}$ of the nMOS switch. The residual second harmonic of the transmit frequency is filtered by the series combination of C2 and L1, allowing the switch array itself to remain a single-ended circuit which produces a non-sinusoidal waveform. The remaining matching network components are selected to achieve the condition where the switch output is critically damped, such that the drain voltage is low when the output current is high and vice versa, thereby allowing high efficiency and low-noise performance.

Furthermore, in order to preserve the gate oxide integrity of the switches 90, the voltage swing at the drain must be controlled by the matching network to satisfy $V_{eff,GOI} < 2 \cdot V_{DD}$, where $V_{eff,GOI}$ represents the equivalent DC voltage on the drain resulting from one RF cycle. This buffer circuit is ideally suited to a low voltage environment in a digital CMOS process because, unlike in class A, B and C amplifiers where the transistor acts as a current source, there is no headroom requirement on $V_{DS}$ with this structure. The only requirement is that $V_{GS}$ must be able to go higher than the threshold voltage for the transistor to turn on, which is naturally guaranteed by the input digital signal. Another advantage of this buffer circuit, implemented in a deep submicron CMOS process, is that the extra input circuitry and output filtering circuitry of class F type amplifiers is not required.

The control logic for each nMOS switch comprises a pass-gate type AND gate whose inputs are the phase modulated output of the ADPLL and the amplitude control word (ACW) from a digital control block. In the DQM implementation of FIG. 14, the amplitude-control word of the polar transmitter is replaced with the I and Q signals each feeding separate arrays of the same structure. It is the on-resistance and driving strength of the switch that is exploited in the DRAC concept to introduce power control of the transmitted waveform and allows the fully-digital method of controlling the output power. The AND gate is implemented as a pass-gate rather than a conventional standard fully static AND gate. This has the advantage of minimizing thermal noise from the AND function which in turn reduces the ultimate broadband phase noise floor of the DRAC. This structure also serves to reduce RF carrier leakage, which could result from clock feed-through given the realistic parasitics of the multiple devices. As described supra, alternative implementations of the AND gate function include using a cascode (or current steering topology) or degenerative device together with the driver transistor. These approaches, however, suffer from degraded output noise performance and increased local oscillator (LO) feed through (via device parasitic capacitance) which limits the dynamic range of the DRAC, and are thus not preferred.

In the example implementation, as shown in FIG. 5, the RF output signal generated by the DRAC circuit is optionally input to an external power amplifier (not shown) where the signal is amplified to the appropriate levels in accordance with the particular wireless standard. The output of the power amplifier is then input to an antenna for transmission over the air. The DRAC can also be implemented with a high output-power level, possibly eliminating the need for further amplification at its output. It is appreciated, that the DRAC circuit may be used in non-wireless applications as well, in which case, the signal would not be fed to an antenna (e.g., cable modem applications).

In deep submicron CMOS technology, the ratio between the maximum output power that can be provided from a supply of about 1.2 V to the minimum output power of a single transistor dictates the maximum number of transistors that can be implemented in the DPA transistor array, and thus limits the basic resolution of the integer array.

Figure 6:
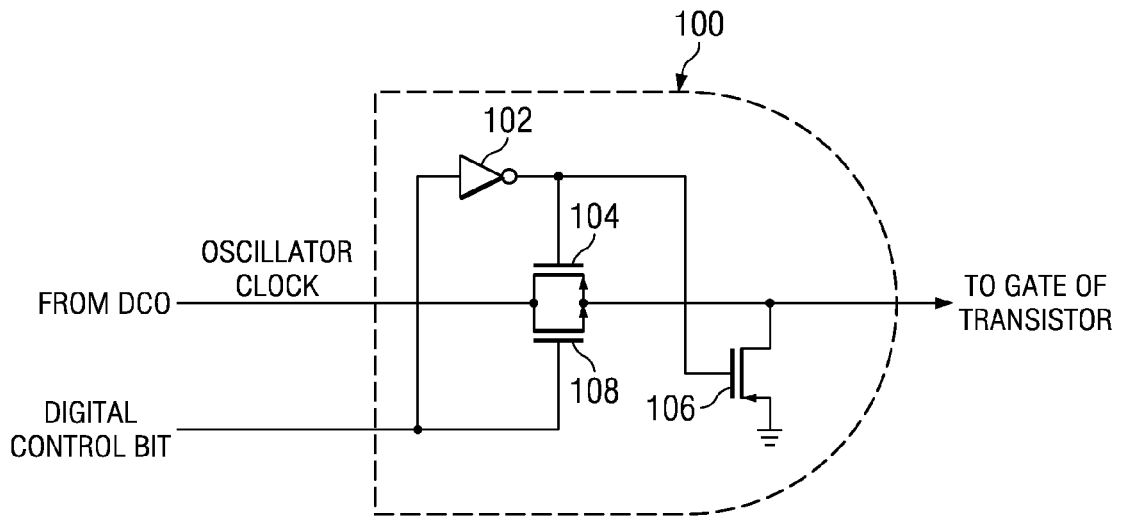
FIG. 6 is a circuit diagram illustrating the structure of the AND gate of the DPA in more detail.

A circuit diagram illustrating the pass-gate AND function of the DPA in more detail is shown in FIG. 6. The pass-gate type AND function circuit, generally referenced 100, comprises a pMOS transistor 104, nMOS transistor 108, isolation/shunting transistor 106 and inverter 102. In operation, the pass-gate permits very efficient implementation of simple gates and requires few transistors, with a small delay due to the single inversion level. Its advantage is that the gate structure effectively filters out digital control noise and provides high isolation between the inputs and between the clock input and the circuit output. The low noise is due to the fact that the output signal does not originate from the gate nodes of the pass-gate, thus the pass-gate contributes virtually zero noise. To achieve additional isolation, the output of the pass-gate is pulled to ground through isolation/shunting transistor 106 when the digital control input is in the off state. This ensures the switch is turned off and further reduces the signal coupling between the clock input and the circuit output.

Figure 7:
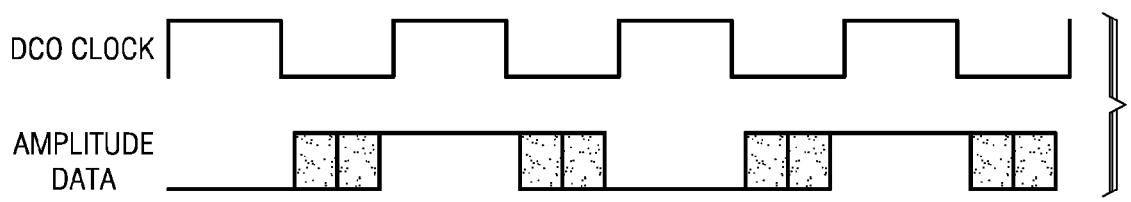
FIG. 7 is a timing diagram illustrating the preferred timing of the amplitude data relative to the DCO clock.

Note that it is critical that the DCO clock edge and the data edge inputs to the AND gates be aligned. The ideal timing for the data change is somewhere in the middle of the DCO clock low state as shown in FIG. 7.

Fully Digital Quadrature Modulator—Separate I/Q Arrays

Figure 2:
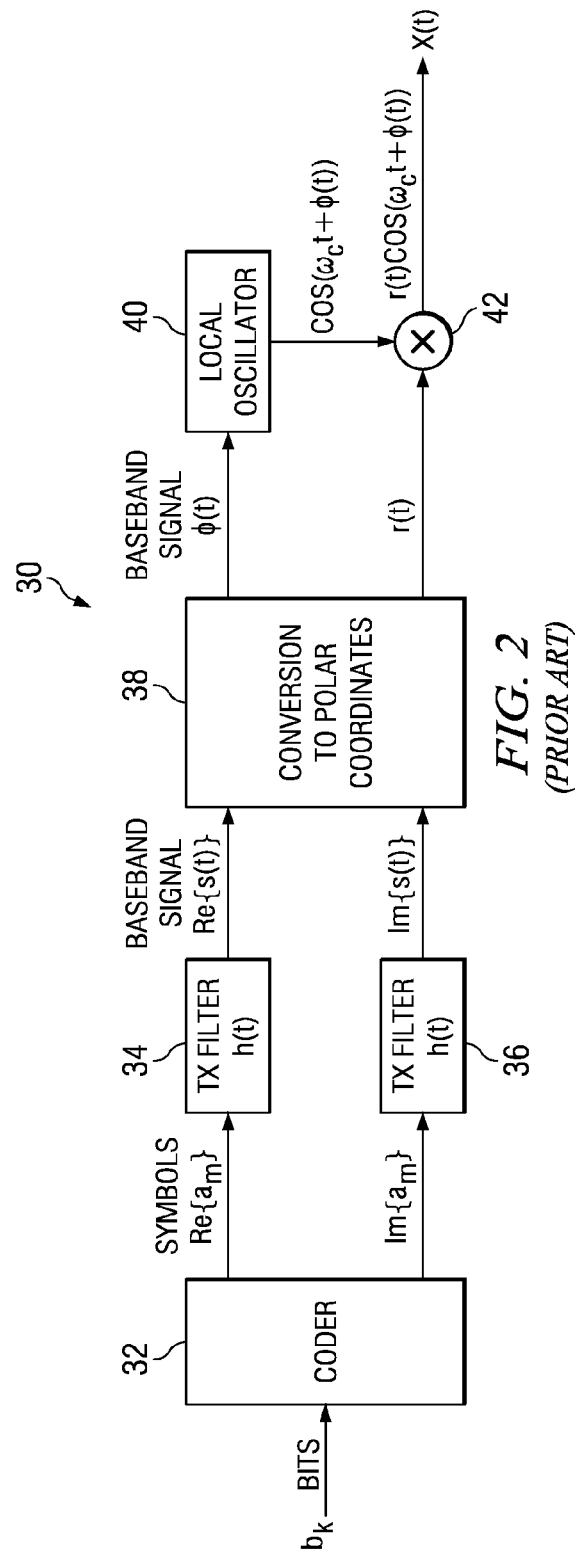
FIG. 2 is a circuit diagram illustrating prior art complex polar modulator with direct phase and amplitude modulation.

The digital to complex-amplitude conversion circuitry of the present invention is based on a principle similar to that of the digital power amplifier (DPA) described supra. The DPA acts as a digital to RF amplitude converter (DRAC), as described in detail in U.S. application Ser. No. 11/115,815, filed Apr. 26, 2005, entitled "Low Noise High Isolation Transmit Buffer Gain Control Mechanism, incorporated herein by reference in its entirety, where a DRAC was used solely for amplitude modulation in a polar structure, as described supra in connection with FIG. 2.

The basic structure of a DRAC used for amplitude modulation was described hereinabove and illustrated in FIG. 5. The digital control bits are produced by an encoder that converts a digital word representing the amplitude into a corresponding set of enabling signals (i.e. digital control bits 92) that allow the clock signal output of the DCO, running at the RF carrier rate, to pass through and reach the transistors in the parallel array. The number of AND gates allowing the clock through would determine the resultant RF amplitude created on the load at the output, thereby realizing a conversion from a digital amplitude control word (ACW) to a corresponding RF amplitude. Since the total current in the bond wire 96 is the sum of the currents of all the transistors, the DRAC performs an additive function. However, since the impedance and voltage at that point are affected by the number of transistors switching at the RF rate, the output power cannot be determined by simple superposition of the multiple branches. Accordingly, the amplitude modulator must employ pre-distortion circuitry to compensate for the AM-AM distortion introduced by this saturation-like effect. Note that although the invention is described in the context of generating the RF output signal by summing the currents generated by a plurality of transistors, it is not to be limited to this. Alternatively, each transistor can contribute a conductance and the RF output is substantially proportional to the sum of the conductances rather than currents. Depending on the region of operation of the switching devices, it could be the on resistance of each active switch that contributes to the controlled amplitude of the output RF waveform. It is also likely that the switching devices undergo change of the dominant operating region in each switching cycle thus resulting in a mixture of the of the current-mode and conductance mode regimes. It is noted that summing currents is not equivalent to summing conductances since each transistor can be replaced by an independent current source whereby the current from each source is added but not their conductances.

Figure 8:
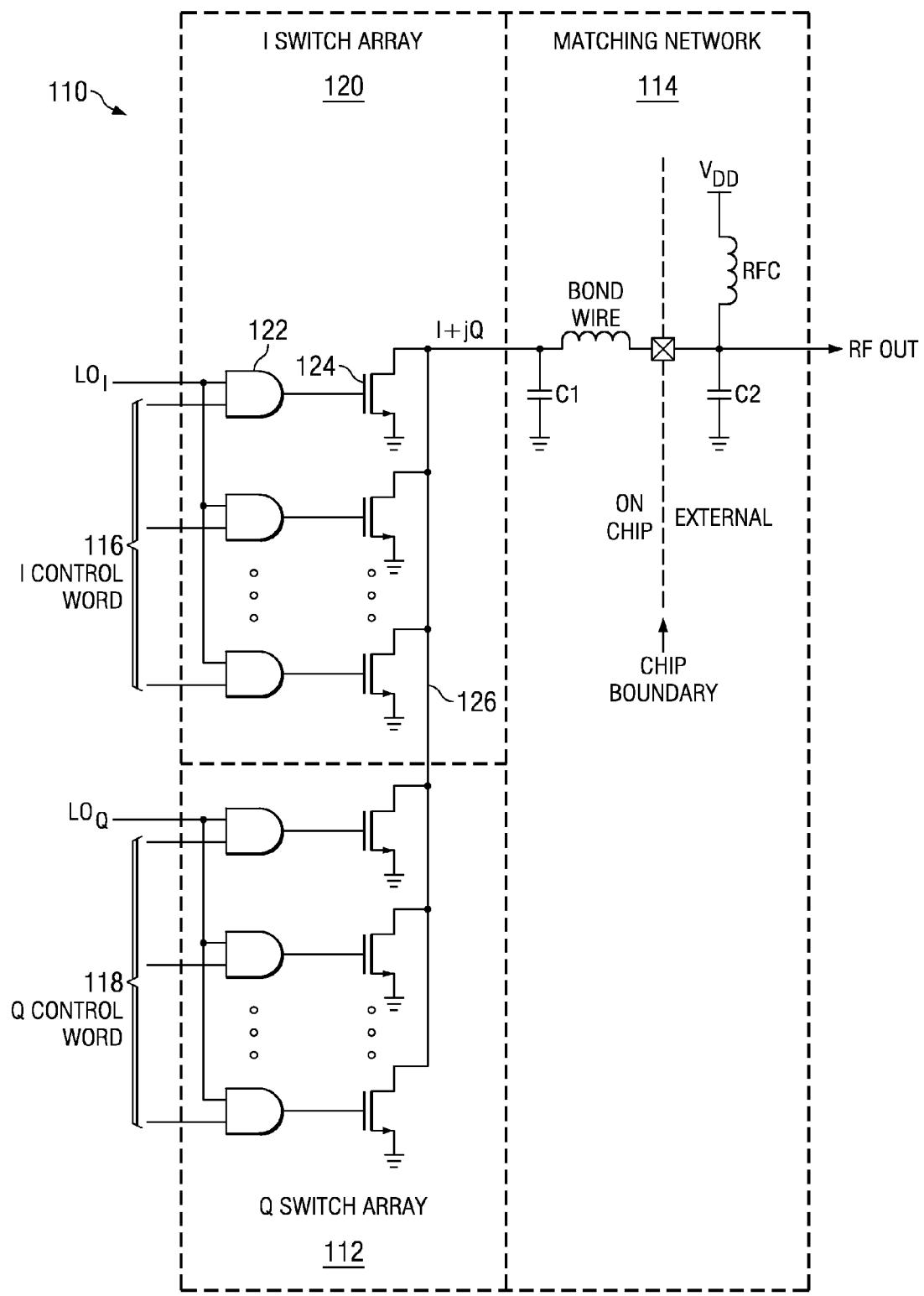
FIG. 8 is a block diagram illustrating the digital quadrature modulator of the present invention incorporating dual I and Q transistor banks and a matching network.

The complex modulator of the present invention makes use of a similar DRAC topology for the purpose of realizing the complex modulation in Cartesian coordinates. This is in contrast with the polar architecture, where the DRAC provides only amplitude modulation, which needs to be complemented with phase modulation. A block diagram illustrating the fully digital quadrature modulator of the present invention incorporating dual I and Q transistor banks is shown in FIG. 8. The complex modulator, generally referenced 110, comprises an I switch array 120, Q switch array 112 and matching network 114. The RF output of the matching network may optionally be coupled to an external power amplifier and external antenna for wireless applications.

Each of the I and Q switch arrays comprises a bank of transistors 124 whose gates are connected to the outputs of AND gates. In the I switch array, each of the AND gates receives the I local oscillator signal $LO_I$ and one bit of the I control word 116. Similarly, in the Q switch array, each of the AND gates receives the Q local oscillator signal $LO_Q$ and one bit of the Q control word 118. The matching network is constructed and operates similarly to the matching network of FIG. 5 described supra.

The summation of currents (or, equivalently, conductances) from the multiple parallel transistors within each I and Q array may be regarded as the realization of the multiplication operation. In the polar case it is the multiplication of the amplitude/envelope signal with the phase modulated carrier $$RF(t)=A(t)\times\cos(\omega_c t+\phi(t)) \quad (5)$$

and in the Cartesian structure it is the multiplications of the I and Q complex envelope baseband signals with the quadrature LO signals.

$$RF(t)=I(t)\times\cos(\omega_c t)+Q(t)\times\sin(\omega_c t) \quad (6)$$

In the Cartesian structure, the parallel connection at node 126 (FIG. 8) further realizes the summation operation of Equation 6.

The mathematical expression in Equation 6 may also be rewritten as a linear combination of the two orthogonal local oscillator signals $LO_I$ and $LO_Q$ $$RF(t)=I(t)\times LO_I+Q(t)\times LO_Q \quad (7)$$

where the coefficients of this linear combination for a given instance t are the instantaneous values of the I(t) and Q(t) baseband signals comprising the complex envelope representation of the modulated signal.

Traditionally, the $LO_I$ and $LO_Q$ signals are sinusoidal and orthogonal as in Equation 6. However, substituting these two functions with any other pair of periodic functions of the same period $T_c=2\pi/\omega_c$ and time shift of $T_c/4$ (equivalent to 90 degrees of phase at the fundamental frequency $\omega_c$) would yield the same desired modulated signal. This is because, as is well known, any periodic function may be represented as a Fourier series of sinusoids which would include a sinusoidal function at the fundamental frequency and additional sinusoidal functions at integer multiples of the fundamental (i.e. the harmonics). In practice, the harmonics could be easily removed from the signal by means of low pass filtering, since the distance between the fundamental to the nearest harmonic on the frequency axis is equal to the carrier frequency. Since the periodic functions $LO_I$ and $LO_Q$ are set to have a quarter of a period of time shift between them, their fundamentals would be at 90 degrees phase shift from one another, and could serve to produce the complex modulated signal of Equation 6 assuming the appropriate filtering is applied.

For the non-sinusoidal case, the linear combination of Equation 7 would be expanded into multiple such combinations comprising pairs of orthogonal sinusoids, all of which would be suppressed by the low pass filtering, except for the sinusoid at the fundamental frequency, which would serve as the desired modulated signal at $\omega_c$.

In particular, various forms of digital waveforms may be used (e.g., rectangular pulses), which would satisfy the quarter period time shift between the $LO_I$ and $LO_Q$ signals. This offers the advantages of enabling a relatively simple digital implementation for the generation of this set of local oscillator signals with high and/or adjustable accuracies, and the possibility of realizing the multiplication functions within the linear combination expression by means of simple on/off switching, as taught by the present invention.

Figure 9:
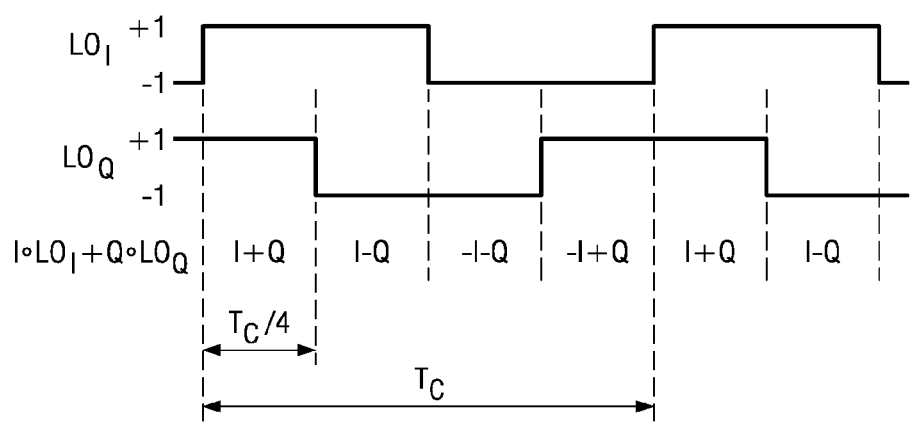
FIG. 9 is a diagram illustrating waveforms for ideal digital (square-wave based) complex modulation with dual polarity.

With reference to FIG. 8, at any instance of time t, a specific number of transistors 124 are switched on within each I and Q array of parallel transistors in accordance with the instantaneous values of I(t) and Q(t) as realized by the I and Q control words, 116, 118, respectively. This is demonstrated with the LO modulating/up-converting waveforms selected as square waves with dual polarity and 50% duty cycle as shown in FIG. 9. Both the I and Q local oscillator signals $LO_I$ and $LO_Q$ can have either +1 or −1 values. The multiplication by I and Q with respective $LO_I$ and $LO_Q$ clocks results in a different result for each of the four quarter cycles of the clocks depending on the particular values of the $LO_I$ and $LO_Q$ clock signals in each quarter. The four results are I+Q, I−Q, −I−Q and −I+Q as illustrated in FIG. 9, which shows the waveforms for ideal square-wave based complex modulation with dual polarity as expressed in Equation 7 supra.

Note that the I and Q control words typically comprise thermometer codes generated by a decoder based on the values of I and Q. In such a case, all the transistors in the transistor array have the same unit-weighting. Alternatively, the transistors may be configured to have a binary weighting which represents the natural encoding. In this case, the thermometer decoder is not used and the I and Q signals are applied directly to the gates.

Figure 10:
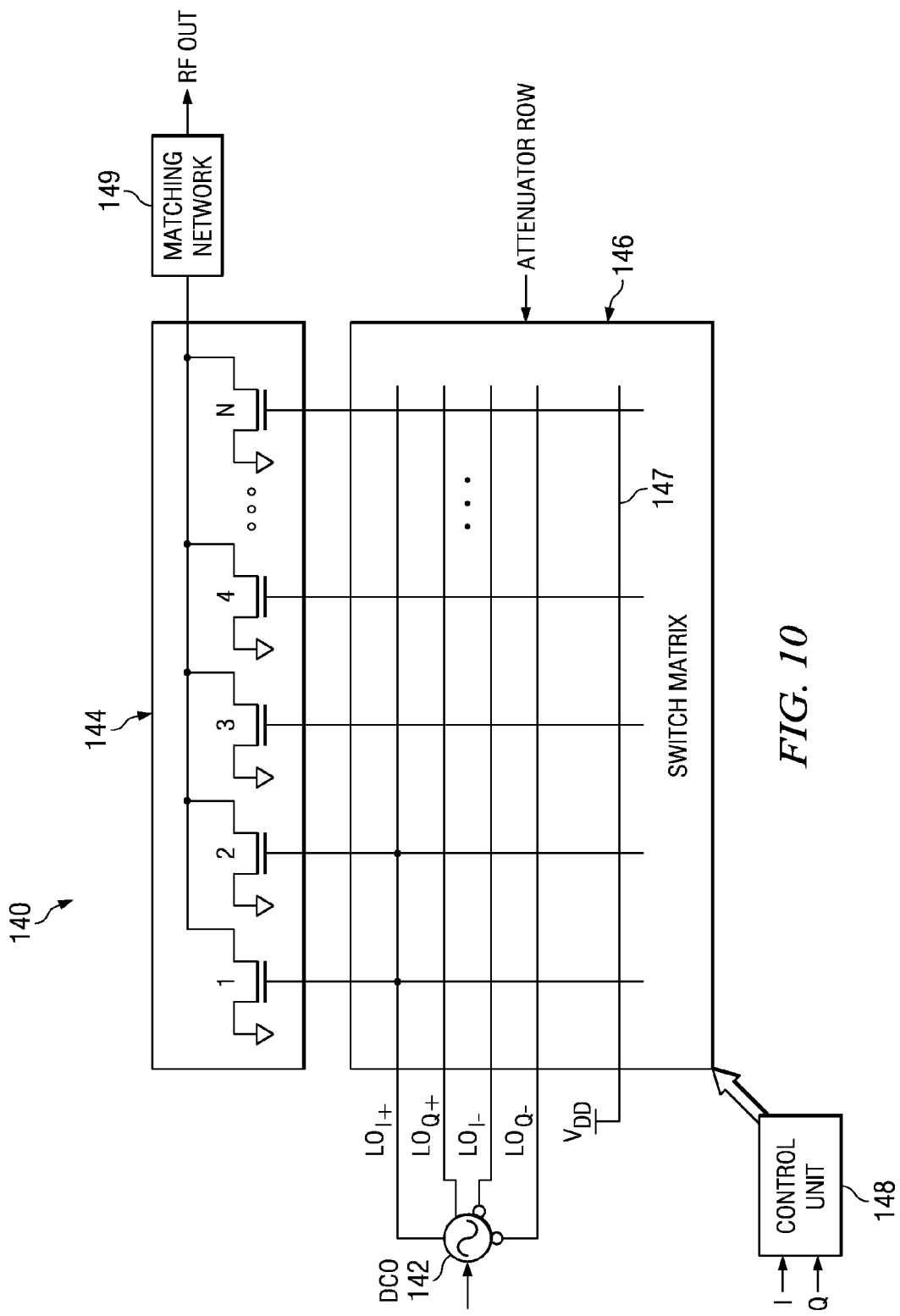
FIG. 10 is a block diagram illustrating the digital quadrature modulator (DQM) circuit of the present invention with an optional attenuator row.

A block diagram illustrating an example embodiment of the DQM with an attenuator row is shown in FIG. 10. In this alternative embodiment, the modulation circuit, generally referenced 140, comprises a DCO 142, digital control unit (CU) 148, switch matrix 147, nMOS transistor array 144 and matching network 149. The switch matrix is used to control the plurality of transistors in the array 144. The switch matrix comprises an optional attenuator row 147 which can be used to shunt some of the unused transistors in the transistor array to reduce the output amplitude and the carrier feed through and ultimately to increase dynamic range of the output. The control unit 148 is adapted to control the attenuator row in the switch matrix as it has knowledge of which transistors are being used during any one clock cycle based on the values of the I and Q input signals. One application of the use of the optional attenuator row is in WCDMA systems which have a 90 dB dynamic range requirement. Using this scheme, gates of the unused transistors are connected to logic '1' thus attenuating both the output power and any leakage.

The DCO 142 provides quadrature output at the RF frequency. The DCO core runs at 2× frequency and quadrature dividers produce 90 degree spaced phases. Low phase noise requirements of the TX may call for a CMOS-type divider (e.g., dynamic) rather than an ECL-type. The transistor array 144 is viewed as an array of current sources (or perhaps resistors) switched on/off at the RF rate, if enabled. Each transistor contributes current (or conductance) at a certain phase assigned by the switch matrix. Note that the transistors are not associated with any particular phase. The current (or conductance) contribution of each transistor is non-linear, particularly with a larger total number of active transistors.

An advantage of the Cartesian modulator of the present invention is that it operates in the phase domain and can change phase instantly (e.g., within one clock cycle). Note that with digital I/Q modulation, the I and Q domains (i.e. the quadrature domains) are regulated digitally.

Another advantage of the modulator of FIG. 10 (and of the modulators of FIGS. 12, 22 and 23) is that the use of the switch matrix and control unit enables the dynamic allocation of transistors within the array to any of the I and Q phase lines. This greatly improves the efficiency of the modulator in that the total number of transistors required is reduced. The switch matrix effectively creates a sharing of the transistors with the consequent reduction in the number of transistors required to generate I and Q signals. The switch-matrix further offers the advantage of eliminating the I/Q gain mismatch potential, as it can dynamically reallocate transistors from the array 308 (FIG. 23) between the I and Q branches.

The DCO is operative to output quadrature phases separated by 90°, namely $LO_{I+}$ (0°), $LO_{Q+}$ (90°), $LO_{I-}$ (180°), $LO_{Q-}$ (270°). Each intersection of a phase line and transistor line within the switch matrix denotes an AND gate or an equivalent switching point. The two inputs to each gate comprise the phase line and a control line from the control unit 148. The output of the logic gates in each column are coupled to the gate of the particular transistor in the transistor array 144.

The switch matrix determines the 'intelligence' of the operation. At each clock cycle, the control unit generates and outputs the appropriate control signals to the switch matrix based on the values of I and Q. Cartesian operation is achieved when the active transistors in the transistor array are connected to different DCO output phases and their relative contributions are allowed to change. Interpolation between phases is achieved when engaging transistors from both phases that have quadrature relationship, e.g., $LO_{I+}$ and $LO_{Q+}$.

For a 45° phase shift, for example, an equal number of N transistors are to be, connected to the $LO_{I+}$ phase line while N transistors are connected to the Q+ phase line. When the contributions of the $LO_{I+}$ and $LO_{Q+}$ transistors are merged together, interpolation is performed, i.e. by vector addition the amplitude will be $\sqrt{2}$ and the phase will be exactly half of 90°, i.e. 45°.

With reference to FIG. 9, since the local oscillator (LO) signals are assumed to be able to take negative and positive values (i.e. dual polarities of −1 and +1), and the I and Q baseband signals also independently can have positive and negative values, the resultant signal may also have dual polarities. This implies a pseudo-differential structure for the transistor array of FIG. 8, where each individual transistor is replaced with a transistor pair, such as in the structure shown in FIG. 11. Each transistor within each transistor pair is on for half of the period. Thus, a 180 degree phase shift exists between the two.

Figure 11:
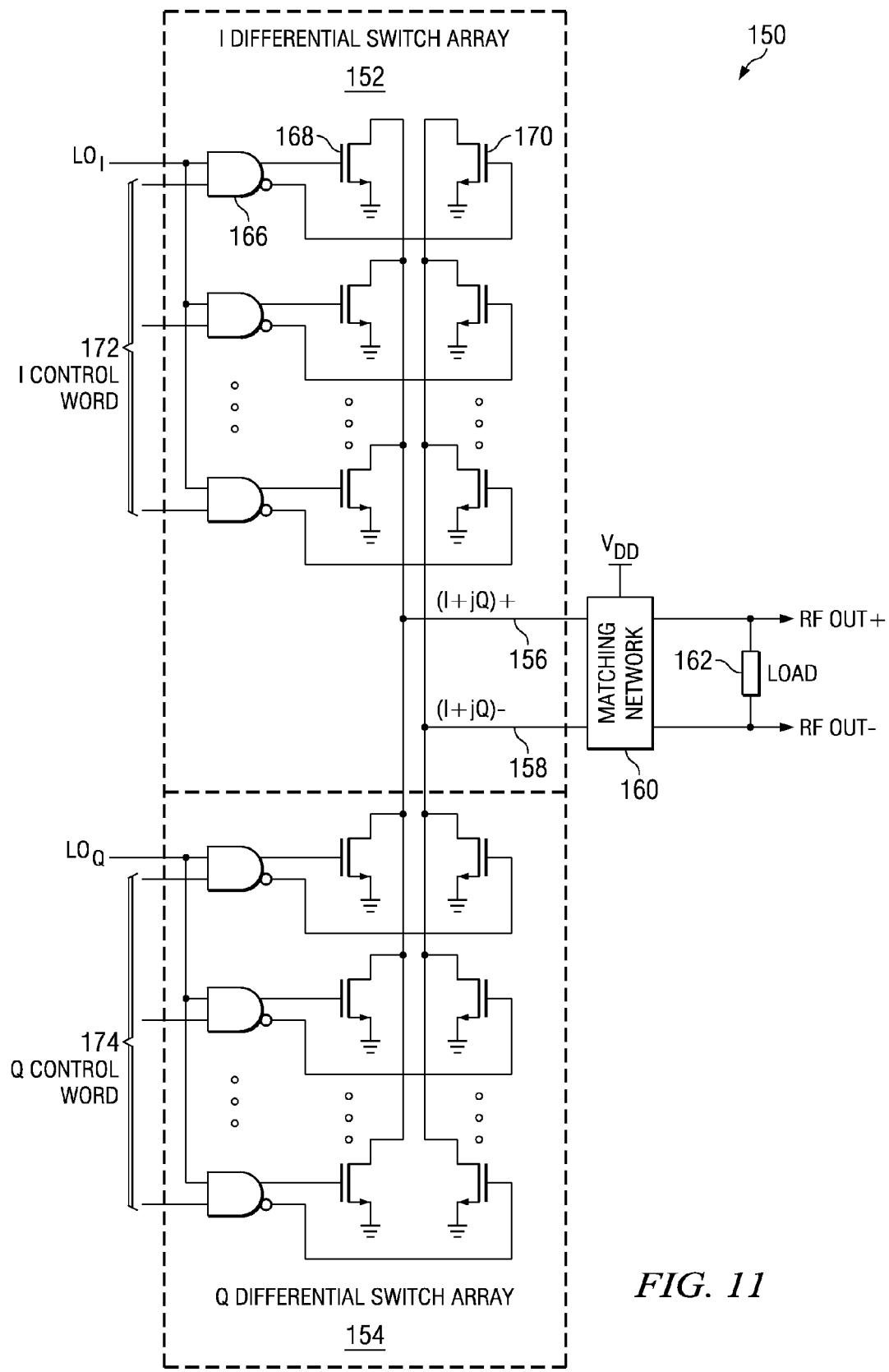
FIG. 11 is a block diagram illustrating the digital quadrature modulator of the present invention incorporating dual differential I and Q transistor banks.

A block diagram illustrating the digital quadrature modulator of the present invention incorporating dual differential I and Q transistor banks is shown in FIG. 11. Similar to the DQM of FIG. 8, this pseudo-differential embodiment of the present invention also realizes complex modulation in Cartesian coordinates while directly supporting both negative and positive output currents. The pseudo-differential complex modulator, generally referenced 150, comprises an I switch array 152, Q switch array 154, matching network 160 and load 162. The differential RF output can optionally be coupled to an external power amplifier (not shown) and external antenna (not shown) for use in a wireless application.

Each of the I and Q switch arrays comprises a bank of transistor pairs 168, 170 arranged to generate a differential signal and whose gates are connected to the differential outputs of AND gates 166. The AND gates 166 are adapted to generate both non-inverted and inverted outputs. In the I switch array, the AND gates receive the I local oscillator signal $LO_I$ and one bit of the I control word 172. Similarly, in the Q switch array, the AND gates receive the Q local oscillator signal $LO_Q$ and one bit of the Q control word 174. The matching network is constructed and operates similarly to the matching network of FIG. 5 described supra.

The summation of currents (conductances) from the multiple parallel transistors within each I and Q array may be regarded as the realization of the multiplication operation of Equation 7, i.e. the multiplication of the I and Q complex envelope baseband signals with the quadrature LO signals. Each pair of transistors is connected in parallel and contributes current to the two parallel connections at nodes 156, 158 to realize the summation operation of Equation 7. In particular, node 156 sums the current for the (I+jQ)+ input and node 158 sums the current for the (I+jQ)− input to the matching network. The differential output (RF OUT+ and RF OUT−) is applied across load 162. Depending on the particular application, the output of the matching network may be input to an external PA (not shown) whose output drives an antenna (not shown). The matching network is tied to $V_{DD}$ and is adapted to generate differential RF OUT+ and RF OUT− output signals across load 162.

Note that alternatively, separate AND gates could be used to drive the gates of transistors 170 separately in both the I and Q transistor arrays. In this alternative embodiment, both non-inverted and inverted clock signals $LO_I$ and $LO_Q$ would be needed while non-differential AND gates are assumed. The AND gates 166 would receive the non-inverted clock signal but would not generate an inverted output, which instead would be available at the output of the separate AND gate using the inverted LO signal (not shown).

Figure 12:
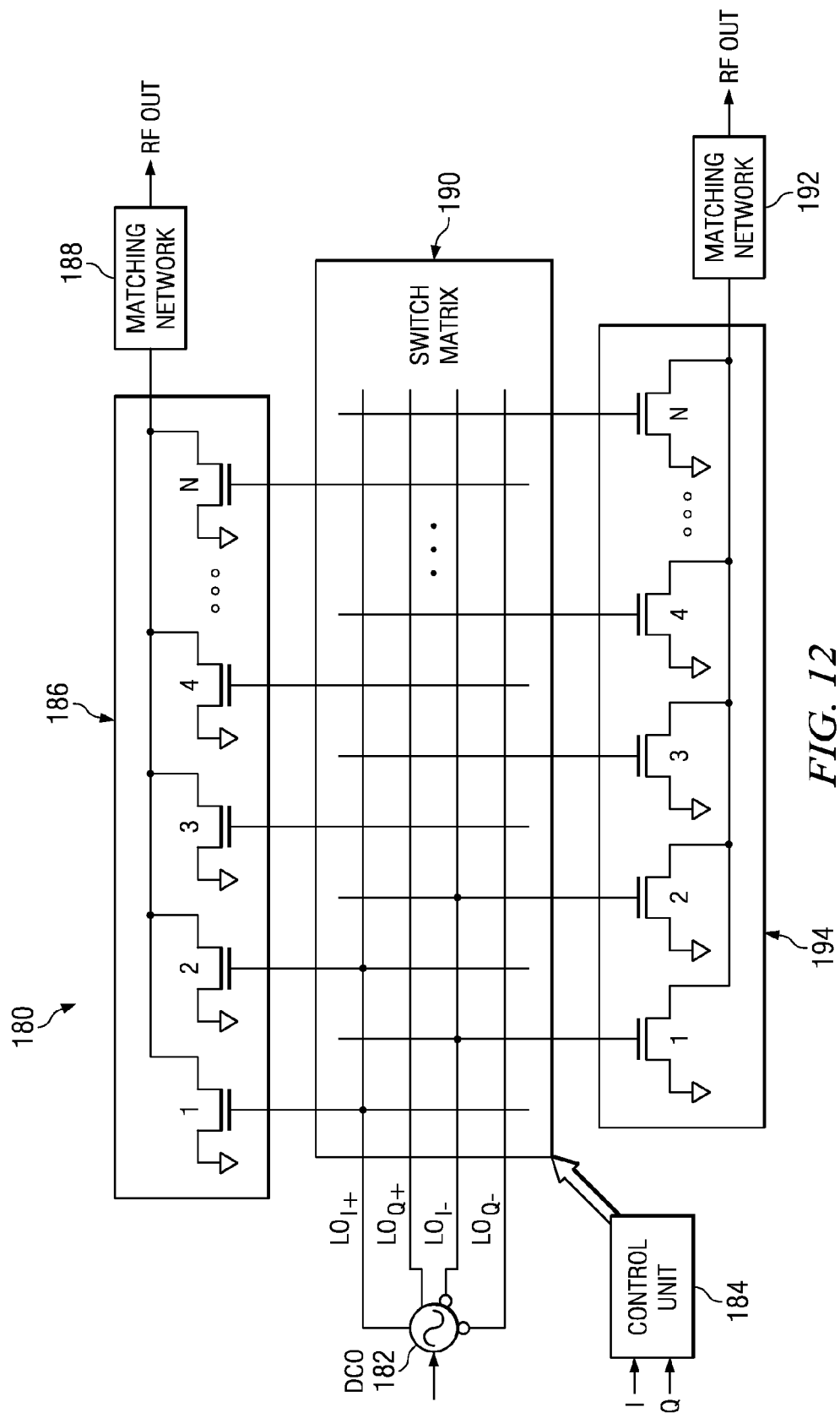
FIG. 12 is a block diagram illustrating the DQM with a pseudo-differential output.

A block diagram illustrating the digital power amplifier (DPA) with a pseudo-differential output is shown in FIG. 12. In this alternative embodiment, the modulation circuit, generally referenced 180, comprises a DCO 182, digital control unit 184, switch matrix 190, two transistor arrays 186, 194 and two matching networks 188, 192. The differential output is produced by recognizing the fact that there are four phases output of the DCO (i.e. $LO_{I+}$, $LO_{I-}$, $LO_{Q+}$, $LO_{Q-}$). From the interpolation, however, only two phases are needed (depending on the quadrant). For example, quadrant 1 uses $LO_{I+}$ and $LO_{Q+}$ while quadrant 4 uses $LO_{I+}$ and $LO_{Q-}$. In each case, two of the phases are not used. Thus, the unused opposite switches in the matrix are input to the second transistor array 194 which generate a negative output resulting in a pseudo differential output from the modulator. The advantage of a differential structure is the increased gain because signals can travel between 0,0 and +1, −1 and −1, +1 to achieve double the amplitude resulting in an additional 6 dB of gain. Further, the differential output signal is less susceptible to common mode noise and distortion.

Figure 13:
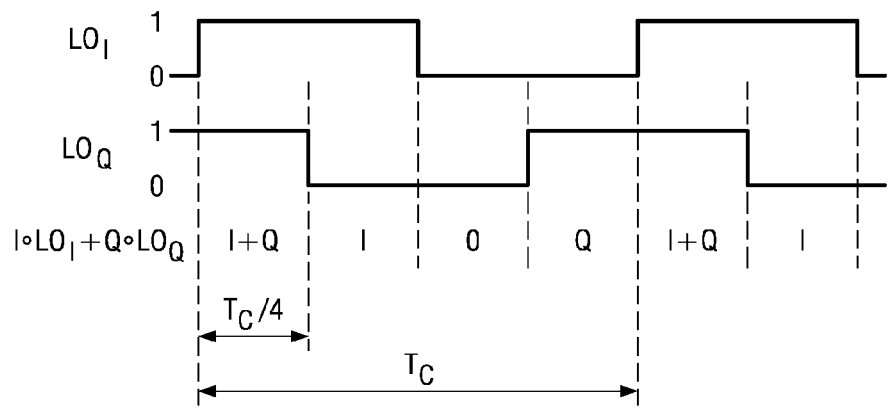
FIG. 13 is a diagram illustrating waveforms for ideal complex modulation with single polarity.

In an alternative embodiment of the present invention, a reduction in realization complexity is provided by modifying the LO waveforms of FIG. 9 to single-polarity versions. A diagram illustrating waveforms for ideal complex modulation with single polarity is shown in FIG. 13. Since the LO waveforms of FIG. 13 only take the values of +1 and 0, there are only three non-zero possible instantaneous results for the modulation expression which correspond to three of the four quarters of the carrier cycle. The four possible results for the summation are: I+Q, I, 0, and Q as shown in FIG. 13.

When a non-differential single-ended structure is assumed for each transistor stage in the modulator array, as illustrated in FIG. 8 described supra, a negative value for I or Q or I±Q could not be directly supported since current can only be forced into the load in one direction by the non-differential stages. To accomplish the negative instantaneous values, a time shift of 180 degrees is used, which can be realized by utilizing an inverted LO signal.

Figure 14:
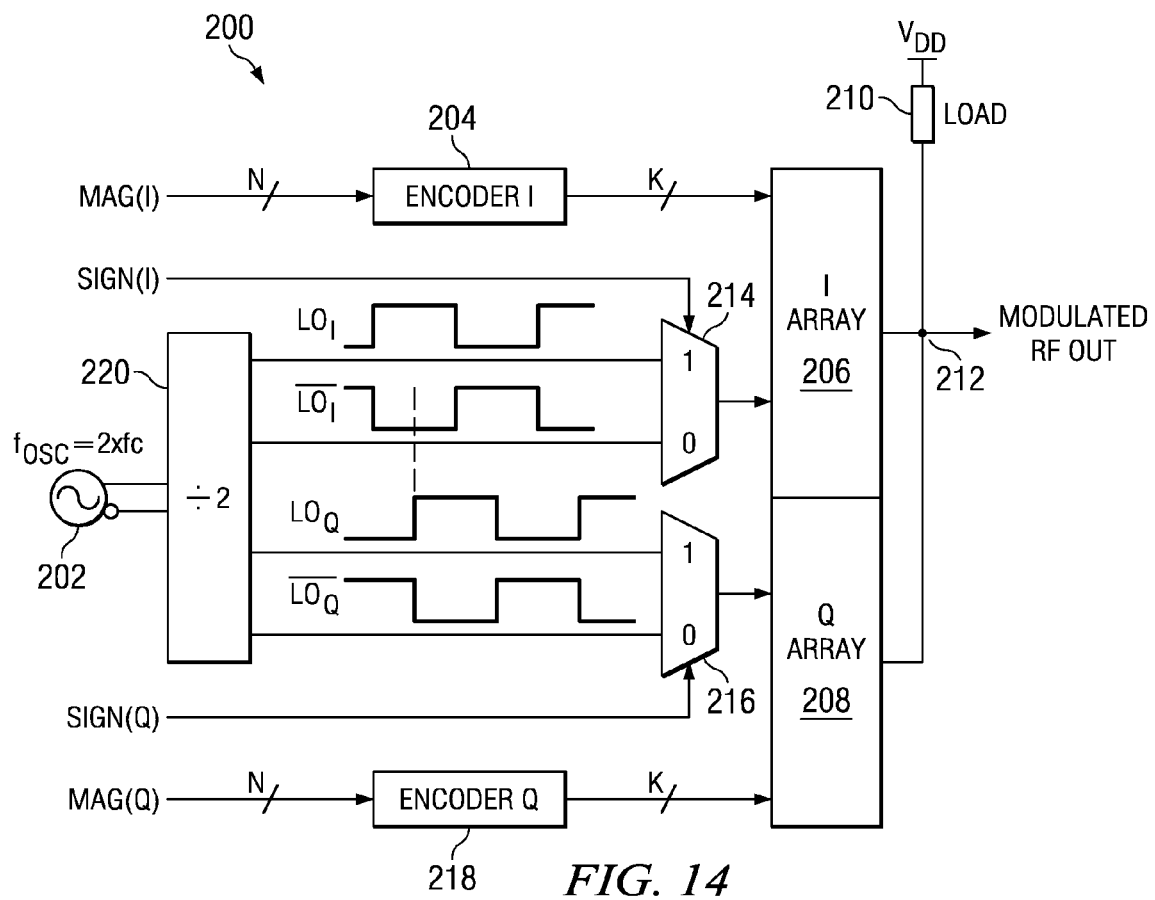
FIG. 14 is a block diagram illustrating an embodiment of the DQM of the present invention incorporating single polarity and dual I and Q arrays.

A block diagram illustrating an embodiment of the quadrature modulator of the present invention incorporating single polarity and dual I and Q arrays is shown in FIG. 14. The modulator, generally referenced 200, comprises a DCO 202, divider by two frequency divider 220, I and Q encoders 204, 218, I and Q LO multiplexers 214, 216 and I and Q transistor arrays 206, 208.

In this embodiment, the DQM transistor array is divided into two logical halves wherein each is clocked by a different LO (90 degrees shifted), such that they represent I and Q. The two halves are shorted at their output, thus current summation is performed and functions to realize the "+" operation in Expression 7 representing the complex modulation.

The representation of negative values for I (or Q) is realized by selecting an inverted $LO_I$ (or $LO_Q$) whenever the sign of I (or Q) indicates a negative value. Thus, rather than needing to create a current in the opposite direction, a current is created that is shifted by 180 degrees (i.e. shifted in time by half an RF cycle) which is equivalent in its effect but does not require the transistors to push current into the load in two different directions, a capability that would only be supported by the more cumbersome differential structure.

In operation, the DCO and divider function to generate non-inverted (i.e. $LO_I$ and $LO_Q$) and inverted versions (i.e. $\overline{LO_I}$ and $\overline{LO_Q}$) of the I and Q local oscillator signals. The sign of I and Q control the select inputs of the multiplexers 214, 216. When the value of I is positive, the non-inverted version of I is input to the I array 206, thereby dictating a vector in the first of fourth quadrants. Similarly, when the value of Q is positive, the non-inverted version of Q is input to the Q array 208, thereby dictating a vector in the first or second quadrant. The output of both the I and Q arrays are summed at node 212 to generate the modulated RF output. The node is tied to $V_{DD}$ via load/circuit 210, which may be an RF choke, a resistive load, a current source with mirroring capability, etc. The conversion of N-bit I and Q magnitude to a k-bit thermometer code is performed by the I and Q encoders 204, 218, respectively. Note that the encoders may be omitted if the transistor arrays 206 and 208 are binary weighted.

When the sign of Q is negative, the inverted form of $LO_Q$ is selected instead of $LO_Q$, thereby dictating a vector in the third or fourth quadrants. The product abs[Q(t)]×$LO_Q$ would then be positive during the positive half-cycle of $LO_Q$, but would be placed in the time domain at a $T_c/2$ time shift with respect to the case where Q is positive, since the non-zero half-cycle of the inverted $LO_Q$ is placed at that time-distance from the non-inverted $LO_Q$. The same applies for I. Consequently, the four possible products I+Q, I, 0, and Q would actually be replaced by abs(I+Q), abs(I), 0, and abs(Q) and may be found at any of the four quarters of the RF cycle. The four possible products will shift around in place depending on the signs of I and Q (i.e. the particular quadrant in which the vector {I,Q} is found).

Similarly, the waveform of FIG. 9 may be adapted to be generated with a single-ended structure, rather than differential, by first applying a "rectification" function on the composite waveform (indicated in the I×$LO_I$+Q×$LO_Q$ results row in FIG. 9). The result of such rectification, where only the positive portion of the waveform is used and the negative portion is omitted, would be two pulses representing two combinations of ±I±Q which are positive. For any given non-zero (I, Q) pair, only two such combinations (e.g., I+Q and I−Q) would be positive, while the other two (−I−Q and −I+Q in this example) would be negative (depending on the quadrant where I, Q would be found). Consequently, the rectified waveform would always have a 50% duty cycle, with the two active quarters of the RF cycle being cyclically consecutive (i.e. $1^{st}$ and $2^{nd}$, or $2^{nd}$ and $3^{rd}$, or $3^{rd}$ and $4^{th}$, or $4^{th}$ and $1^{st}$). As I and Q vary in time (typically at a rate much slower than the RF carrier frequency), the two active quarters would shift in time between these four possibilities. This is contrary to the realization implied in FIG. 13, where the duty cycle is 75% as a result of only one quarter of the RF cycle being zero.

The mathematical expression that may be used to represent the modulator implied by the waveforms of FIG. 9, after rectification is applied for the purpose of implementing it with a single-ended circuit, may be written as:

$$RF(t) = \text{Rectify}(I(t) \times LO_I + Q(t) \times LO_Q) \quad (8)$$

The Rectify function is defined herein to replace all negative values with zero as expressed below $$\text{Rectify}(y) = y \text{ for } y > 0, \text{ otherwise } 0 \quad (9)$$

or alternatively $$\text{Rectify}(y) = \frac{1}{2}(1 + sgn(x)) \cdot y \quad (10)$$

The rectification, however, is a non-linear function that could distort the signal. For a symmetrically modulated signal, which is characteristic of commonly used communications standards, the distortion suffered may be easily overcome, such that the desired spectrum of the ideal expression of Equation 6 could be obtained by simple filtering and compensation.

The single-ended realization of the modulator using the waveforms of FIG. 12, which is preferred, may be represented by the following mathematical expression $$RF(t) = \text{Rectify}(I(t) \times LO) + \text{Rectify}(Q(t) \times LO_Q) \quad (11)$$

Where $LO_I$ and $LO_Q$ are assumed to toggle between +1 and −1 and not +1 and 0 as shown in FIG. 13. Expressions 8 and 11 are not identical and would appear as different time-domain waveforms representing the same modulated signal. However, after appropriate filtering and compensation, they would both produce the desired spectrum of the ideal signal of Expression 6.

Figure 15:
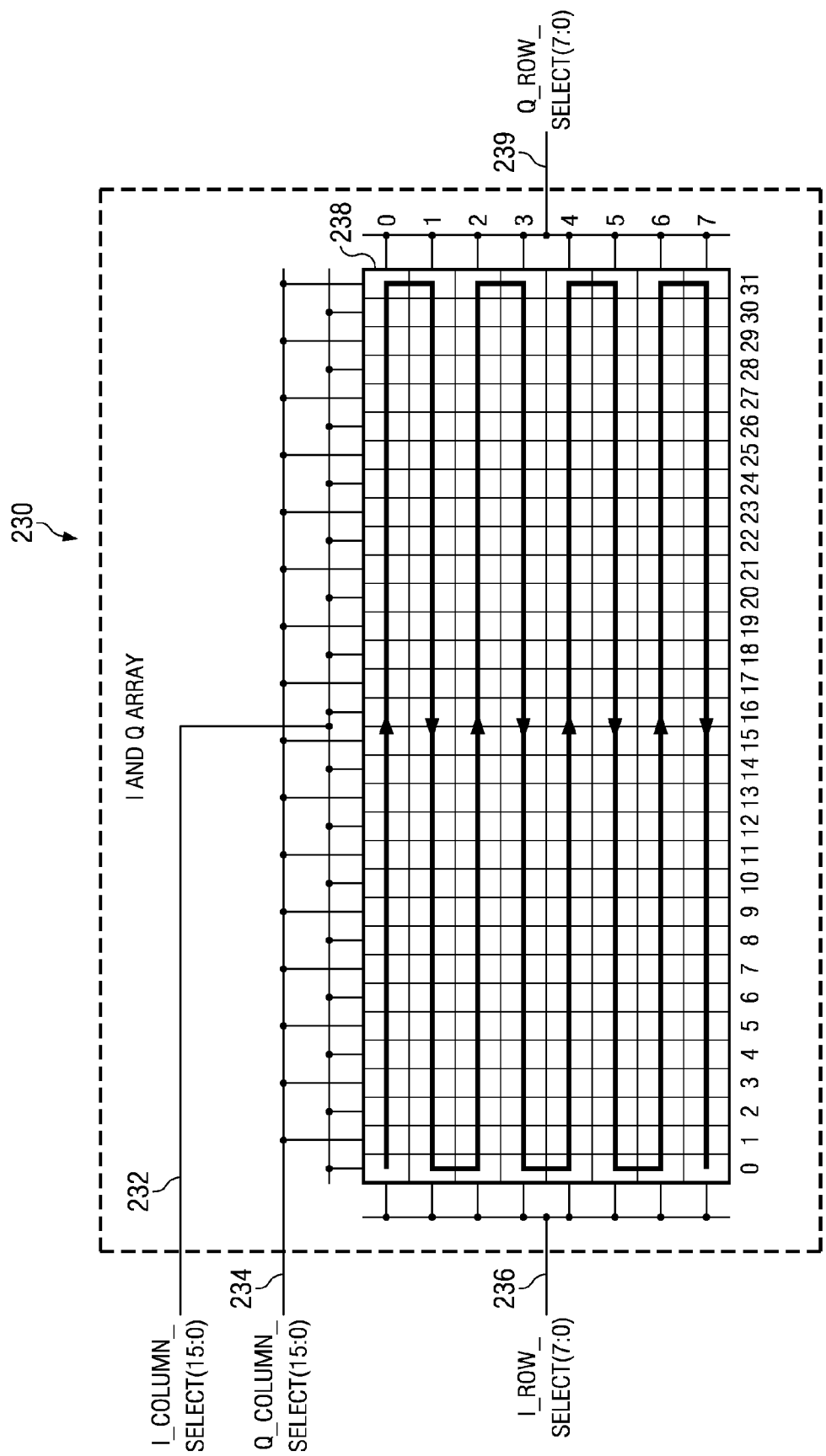
FIG. 15 is a block diagram illustrating the organization of the transistors with the I and Q arrays of FIG. 14.

A block diagram illustrating the structure of the combined I and Q array of FIG. 14 in more detail is shown in FIG. 15. In this example embodiment, interleaving is used in order to reduce potential gain-mismatches between the I and Q arrays resulting from mismatches between transistors. The intertwining of the transistor arrays reduces the potential of "geographical" variations between the two arrays, which could result in different gains, such as a result of changes in the oxide thickness at the gate, which varies the threshold voltage of the FETs and consequently the current through them for a given gate voltage.

The I and Q array, generally referenced 230, is implemented as a single physical array which functions as the two logical I and Q arrays 206 and 208 of FIG. 14. In this example, the dimensions of the array are 8 rows by 32 columns of cells 238. A 16-bit I column select 232 and 8-bit I row select 236 determine the number of switch elements (e.g., transistors) that are turned on for the I output. The I and Q encoders 204, 218 (FIG. 14) are operative to convert the I and Q magnitude to a thermometer code meaning a total number of transistors equal to the value of the thermometer code are turned on. Similarly, a 16-bit Q column select 234 and 8-bit Q row select 239 determine the number of transistors that are turned for the Q output. Thus, the 32 columns of the array are shared with 16 for I and 16 for Q.

To reduce the transistor mismatch from PVT variations due to the different physical locations of the transistors within the array, the I and Q portions of the array are intertwined. To further reduce transistor mismatch, the order of the turning on the transistors is modified such that a snake pattern is used to traverse the array as indicated in FIG. 15. Once at the end of a row, the transistors are turned on in the next row in a direction opposite that of the previous row. This serves to minimize the transistor mismatch due to row changes.

Figure 16:
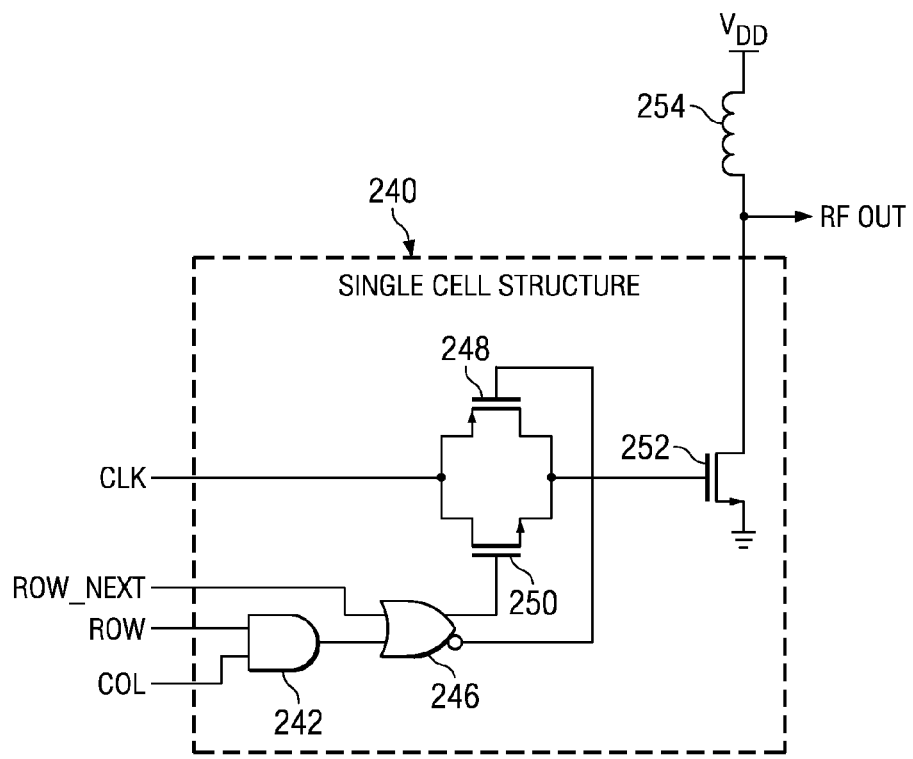
FIG. 16 is a circuit diagram illustrating the structure of a single cell of the array of FIG. 15 in more detail.

A circuit diagram illustrating the structure of a single cell 238 of the array of FIG. 15 in more detail is shown in FIG. 16. The single cell structure, generally referenced 240, comprises an AND gate 242, OR gate 246, transistor pair 248, 250 and transistor 252. In operation, the local oscillator clock signal is input to the pass-gate type transistor configuration made up of pMOS transistor 248 and nMOS transistor 250. The gates of these transistors are driven by the output of OR gate 246. The row and column signals of the particular cell are gated by AND gate 242 and the output is applied to one input of the OR gate 246. A row_next signal is applied to the second input of the OR gate. The row_next signal is active for cells in the last row of the array to be turned on. The row_next signal is generated in accordance with the appropriate thermometer code. The output of the pass-gate is applied to the gate of transistor 252. When on, transistor 252 contributes a portion of current that is summed with the current from other cells that are also turned on in synchronization with the CLK signal (representing one of the LO signals). The summing node RF out is pulled to $V_{DD}$ via choke 254, or connected to load 210 of FIG. 14, in the general case.

Fully Digital Quadrature Modulator—Shared I/Q Array

As described supra, the Cartesian summation may be realized by separate transistor banks for the I and Q branches that are switched with clocks that are at a 90 degrees phase-shift to each other. In accordance with the present invention, the Cartesian summation may also be realized by a combined transistor bank that serves both the I and Q inputs. The combined transistor bank is shared between the I and Q branches. In both cases, the saturation effect described previously must be considered and could cause I⇋Q interaction that would require complex pre-distortion (when superposition cannot be assumed for the I and Q contributions in the modulator). The I⇋Q interaction may be eliminated when the I and Q stimuli are not simultaneously provided to the modulator and the modulator does not exhibit any memory effects. In such a structure, considering the summation of Expression 6 above, the response to the I stimuli could be independent of the Q value and vice versa. The $LO_I$ and $LO_Q$ waveforms for such a DQM structure with shared I/Q array may be of the form described in FIG. 17.

Figure 17:
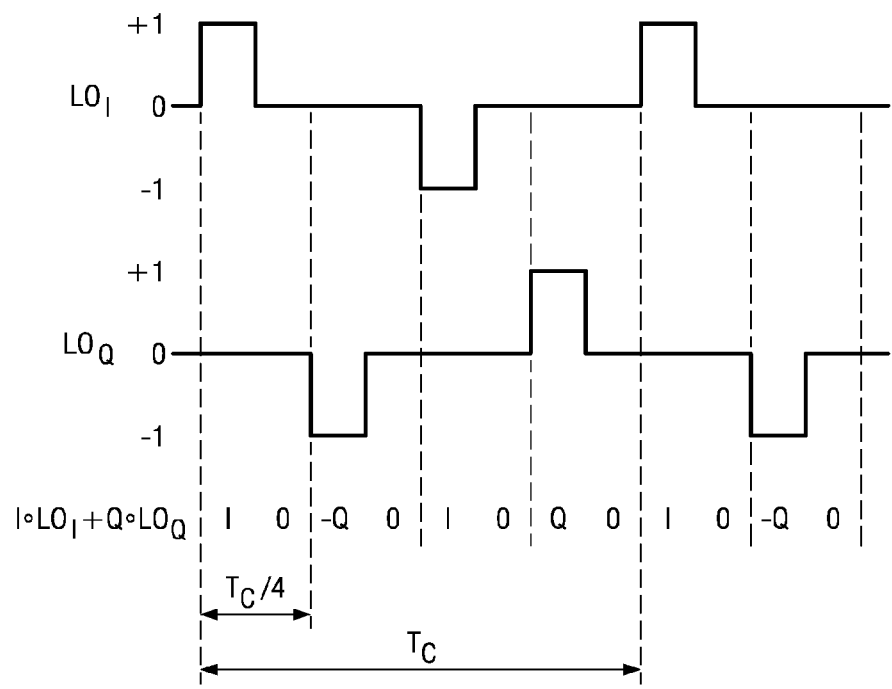
FIG. 17 is a diagram illustrating waveforms for a DPA with shared I/Q array.

A differential structure can directly implement the modulating expression of Equation 7

$$RF(t) = I(t) \times LO_I + Q(t) \times LO_Q \quad (7)$$

where both positive and negative polarities may be supported, corresponding to the two directions of current that each differential stage may produce in the load. The single-ended version for this case could be mathematically described by Expression 11

$$RF(t) = \text{Rectify}(I(t) \times LO_I) + \text{Rectify}(Q(t) \times LO_Q) \quad (11)$$

where the $LO_I$ and $LO_Q$ waveforms are those of FIG. 17 and are Tc/4 shifted from one another, as required.

The advantage of this shared structure is that within the transistor array, the contributions for I and for Q are generated at separate instances and are not simultaneous. This enables the use of time-multiplexing that can be implemented at the input to the array. Each quarter-cycle the appropriate stimuli would be applied for a certain short duration of time, such that its effects would be substantially nil by the time the next stimuli is applied Tc/4 later. Once the composite signal having I and Q contributions occurring at different instances is passed through the bandwidth limiting filter, the continuous summation could take place yielding the desired result of Expression 6. Since the I and Q share the same transistor array (both in the differential and in the single-ended version of this narrow-pulse based system), there is no I/Q gain mismatch concern.

The summation may also be realized digitally, and applied to the array every quarter cycle (i.e. every Tc/4). This eliminates the need for feeding the LO signals into the array and reduces the functionality of the modulator circuit from that of a DRAC to a DAC. In other words, the modulator circuit is operative to convert the instantaneous digitally represented stimuli to a corresponding analog level, as opposed to the conversion of a digital stimuli to a corresponding RF amplitude.

Figure 18:
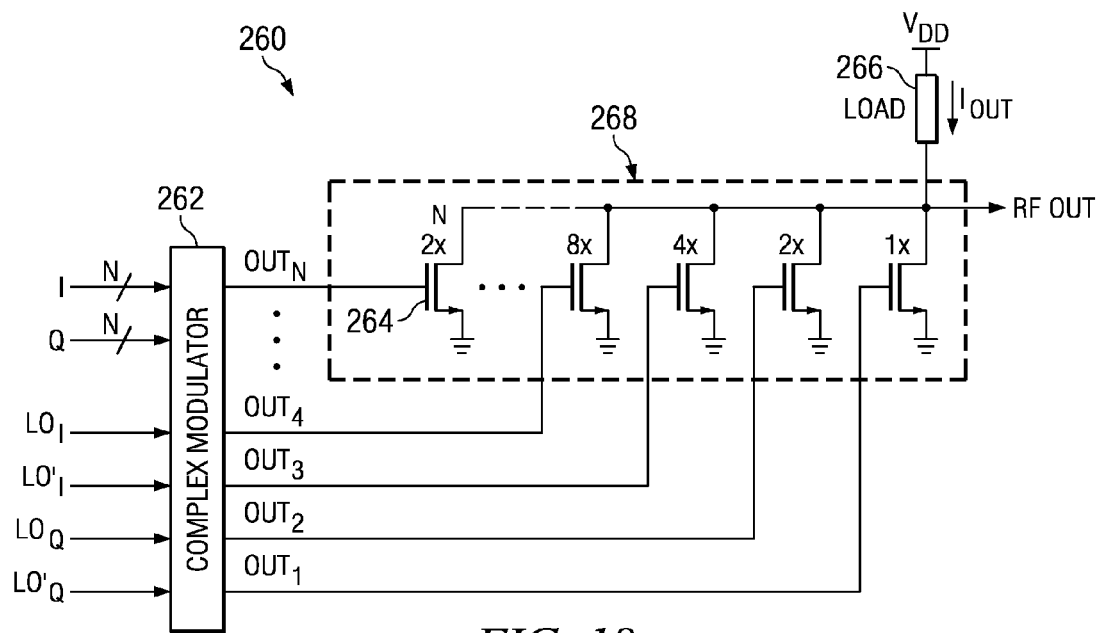
FIG. 18 is a block diagram illustrating the complex digital modulator incorporating a single shared array of single-ended topology with binary weighting.

A block diagram illustrating the DQM incorporating a single array with binary weighting is shown in FIG. 18. The modulator structure, generally referenced 260, comprises a single array of transistors 268 that are used rather than two separate arrays dedicated to I and Q. A key advantage of this structure is that it inherently eliminates the I/Q gain mismatch problem commonly found in quadrature modulators, since the two quadrature components of the complex signal are processed by the same elements on a time division multiplexing basis.

An advantage of the dual-array structure described supra is that the addition operation within I+jQ is performed in an analog manner by the summation of currents in the common node where the drains of all the transistors from both arrays are connected. This allows the circuitry preceding the switching elements to run at a relatively low rate (i.e. corresponding to the sampling rate of the I and Q baseband signals), while only the AND operation preceding each transistor runs at a high rate since this is where the mixing/multiplication operation with the LO signal takes place.

Figure 21A:
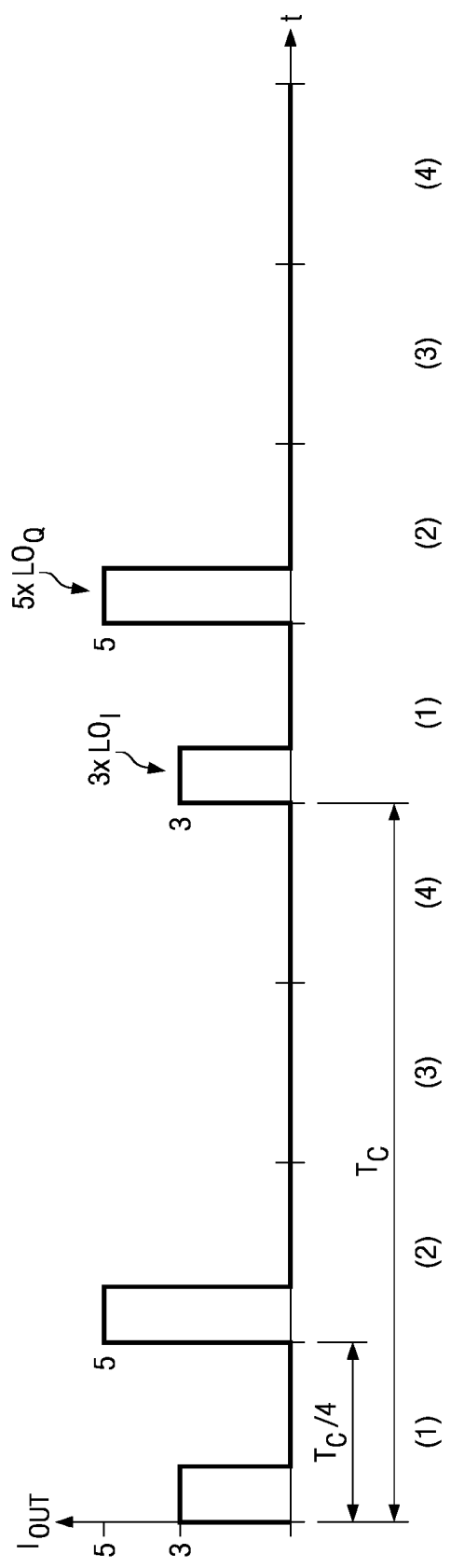
FIG. 21 is a diagram illustrating waveforms of example outputs of the array for the modulator structure of FIG. 18.
Figure 21B:
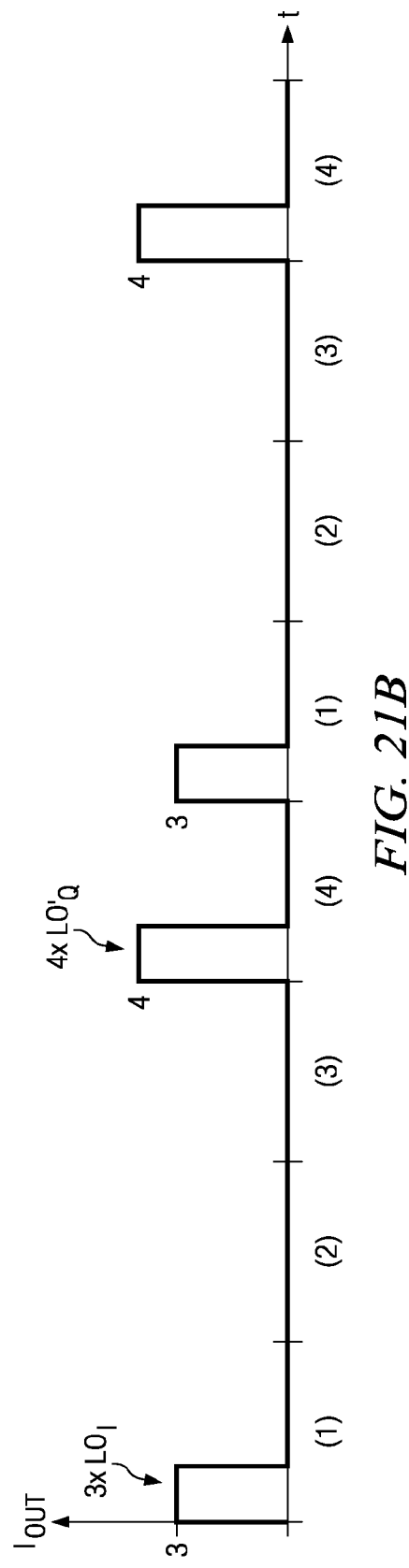

Contrarily, the single array structure requires that either the thermometer decoder is realized to run at the high rate necessary to support the waveforms of FIGS. 21A and 21B, described infra, or the array may be constructed with binary weighted elements rather than equally sized unit-weighted elements, thus eliminating the need for the thermometer decoder altogether.

The function of the complex modulator block 262 shown in FIG. 18 is to generate the switching patterns/waveforms for the transistors in the array 268 based on the N-bit I and Q inputs and the pulses of the LO signals, such that waveforms of the type shown in FIGS. 21A and 21B are constructed. The DQM 260 accomplishes the conversion of the digital inputs to a corresponding RF signal by converting the instantaneous value of I to a corresponding number of transistors (and output current) that are switched on during a duration of $T_p$ starting at the first quarter of the RF carrier cycle if I is positive or at the third quarter if I is negative, by using the $LO_I$ and $LO'_I$ signals to gate the I input. Similarly, by using the $LO_Q$ and $LO'_Q$ signals to gate the Q input, a pulse of $T_p$ duration and having a magnitude corresponding to the instantaneous value of Q would be generated at the second quarter of the RF carrier cycle for a positive Q, or at the fourth quarter for a negative value of Q.

Figure 20:
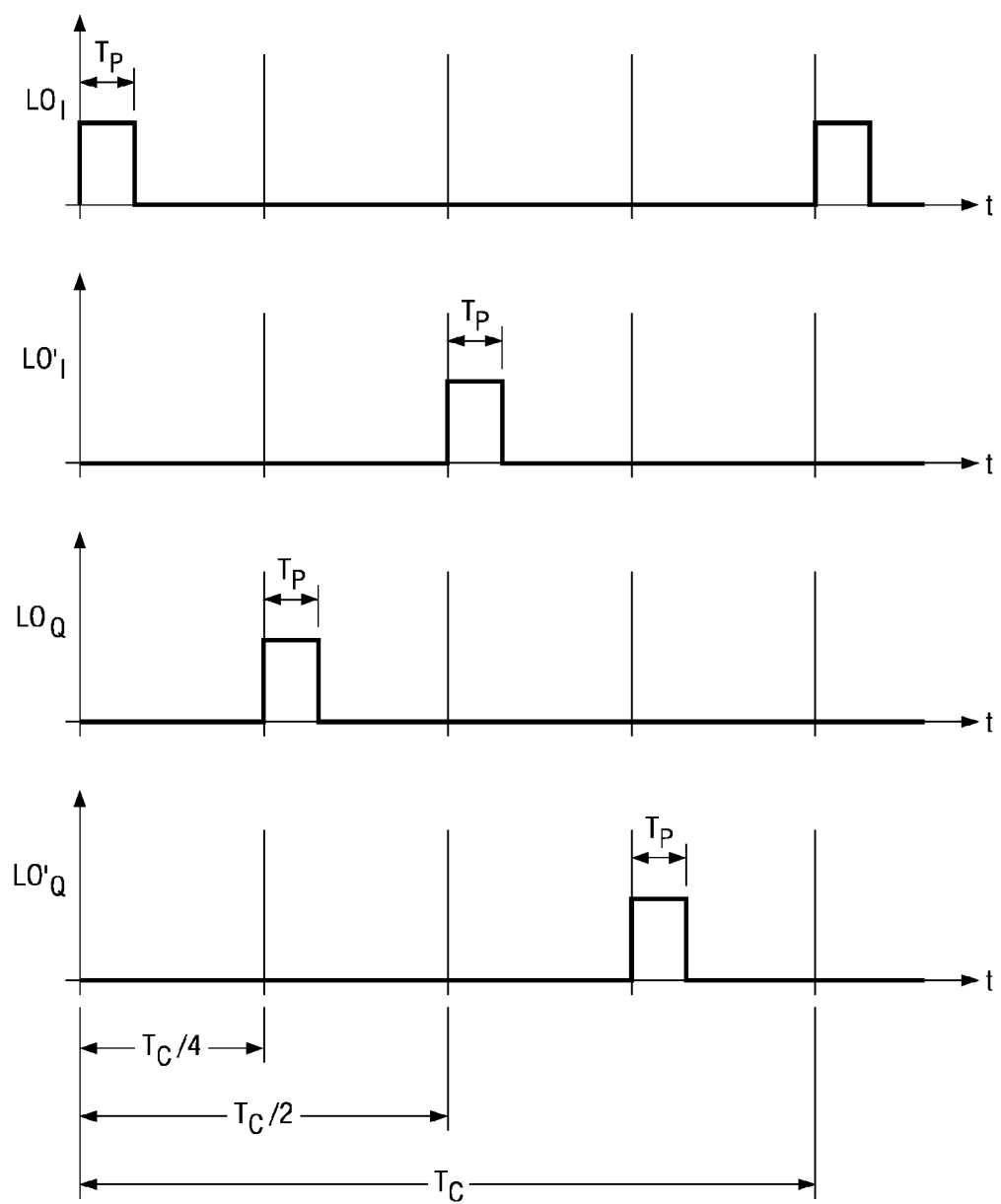
FIG. 20 is a diagram illustrating waveforms for a single-ended single-array based quadrature modulator such as that of FIG. 18.

A diagram illustrating local oscillator waveforms for such a single-ended single-array based DQM is shown in FIG. 20. Note that the pulse duration $T_p$ does not necessarily need to be limited to a value less than $T_c/4$, as implied in FIG. 20. It is appreciated that other $T_p$ pulse durations may be used depending the particular implementation and application. A narrower pulse duration for $T_p$, however, may help in eliminating interactions between the I and Q signals, depending on parasitics and passive components, which would introduce memory between the quarter cycles, as a function of the frequency of operation. The effect of a pulse from one RF quarter cycle extending into the next quarter cycle in the presence of non-linear effects in the array (e.g., saturation) could result in distortions such as AM-to-PM distortion. Such distortions, however, can be overcome digitally once characterized and therefore do not inhibit the use of such circuit.

The existence of such memory effects depends on the type of load through which $I_{out}$ flows in FIG. 18. If the load 266 comprises an inductor (e.g., bond wire used to connect that node to an external pin of the IC), then the extent of the memory effects would depend on the value of inductance of the load with respect to the frequency of operation. This means that the biasing conditions created by a pulse originating from the I branch may affect the response of the circuit to a subsequent pulse from the Q branch, and vice-versa.

If, however, the load 266 (FIG. 18) is sufficiently resistive such that memory effects can be neglected and the output current is forced to flow through the next stage where it is mirrored and/or filtered/processed without affecting the node where the summation takes place, then the memory effects, potentially resulting in AM/PM distortion, may be eliminated and the pre-distortion circuitry can be simplified to AM/AM compensation only. The AM/AM distortion compensation would comprise compensation for the saturation curve that causes the relationship between the instantaneous $I_{out}$ and the digital I or Q input that created it, to be nonlinear.

Figure 19:
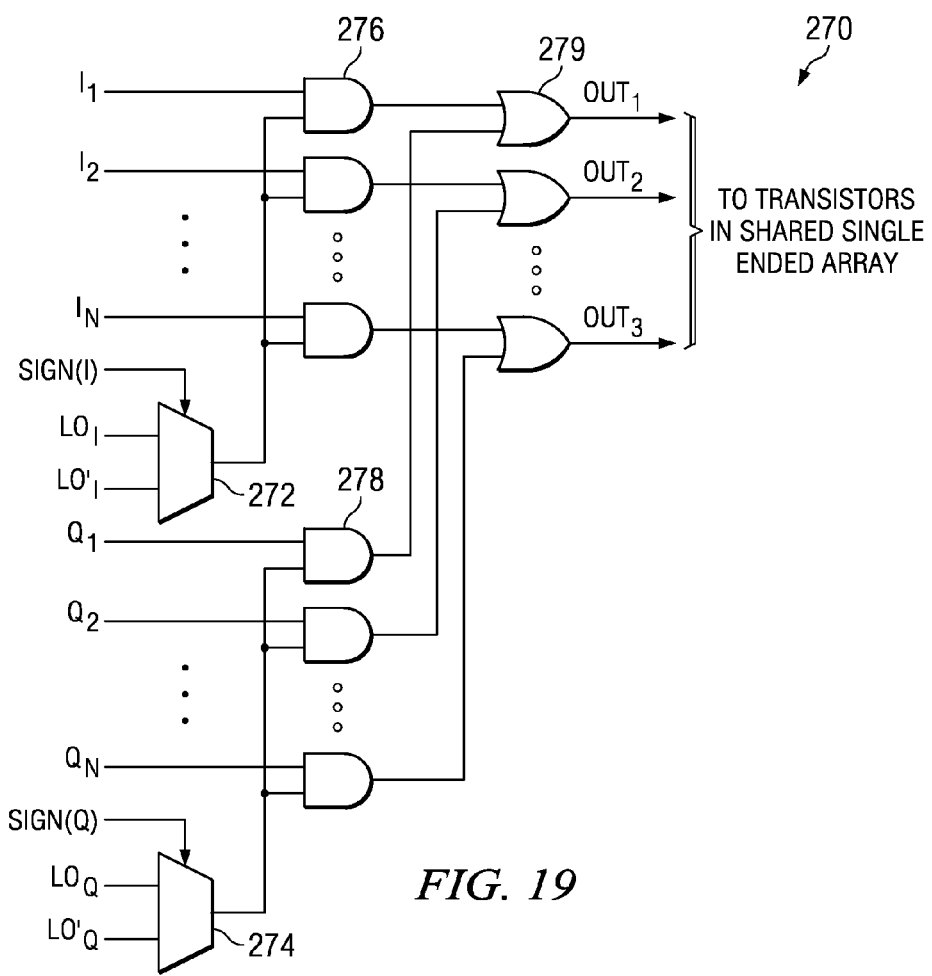
FIG. 19 is a block diagram illustrating an example structure of the complex modulator of FIG. 18.

A block diagram illustrating the circuit structure of the complex modulator of FIG. 18 in more detail is shown in FIG. 19. The circuit, generally referenced 270, comprises I and Q multiplexers 272, 274, I and Q AND gates 276, 278 and OR gates 279. The circuit 270 functions to realize the gating function (i.e. multiplication with the LO signals) for each bit in the N-bit digital I and Q signals, where N is the width of the I and Q words (chosen according to the resolution to be supported). In operation, the select inputs of the multiplexers 272, 274 are the sign of I and Q, respectively. Positive values of I couple the $LO_I$ clock signal to the AND gates 276 while negative values of I couple the $LO'_I$ clock signal to the AND gates. Similarly, positive values of Q couple the $LO_Q$ clock signal to the AND gates 278 while negative values of Q couple the $LO'_Q$ clock signal to the AND gates. The outputs of the two sets of AND gates are ORed 279 to generate the output signals $OUT_1$ through $OUT_N$ which are subsequently input to the gates of the transistors in the transistor array.

In FIG. 18 the transistor array 268 comprises a binary weighted array and thus an output $OUT_k$ of circuit 270 of FIG. 19 is directly connected to the appropriate $k^{th}$ transistor in the array 268.

Alternatively, an array of individually controlled unit transistors may be employed (i.e. thermometer coded), whereby a thermometer decoder is placed between the N outputs of the circuit 270 of FIG. 19 and the $2^N$ inputs of the unit-weighted transistor array 268 (FIG. 18). Note, however, that this may impose a limit on the frequency of operation of the modulator, since the thermometer encoding would be required to switch at rates corresponding to $T_p$ and $T_c/4$.

Alternatively, the thermometer encoding may be placed at the input of the circuitry of FIG. 19 such that instead of N pairs of gates (i.e. for the N bits of I and Q), the circuit would comprise $2^N$ pairs of gates, each running at the high rate but with thermometer encoded $I_m$ and $Q_m$ inputs, where m=1, 2 ... $2^N$.

The three different functions shown in FIG. 19 (i.e. multiplexers/selectors, AND gates/multipliers, OR gate/adder) are implemented using any circuit suitable for the frequencies of operation of the modulator. For example, depending on the application, the frequencies of operation may permit the use of standard logic gates generated by a commercially available digital synthesis tool from a standard library of cells. In other applications, higher frequencies may require circuits having more of an analog nature that may not reside in a standard digital library.

In particular, the circuitry for the AND gates 276, 278 (FIG. 19) may be realized by means of a pass-gate structure where the $I_k$ or $Q_k$ signal serves to enable the passing of $LO_I$ or $LO_Q$ respectively. The OR gating function of their outputs can be realized by shorting the outputs of two pass-gates (i.e. wired logic). The structure and operation of pass-gate type structures are described in detail in U.S. application Ser. No. 11/115,815, cited supra.

Mathematically, the expression implemented by the circuit of FIG. 19 can be expressed as $$OUT_k = Rectify(I_k \times LO_I) + Rectify(Q_k \times LO_Q) \qquad (12)$$

where the $LO_I$ and $LO_Q$ waveforms are those illustrated in FIG. 17 and $I_k$ and $Q_k$ are the $k^{th}$ bits of I and Q respectively (k=1, 2 ... N). Alternatively, if a thermometer decoder were to be placed between the I and Q signals and the circuit of FIG. 19, the expression would be the same, but with m replacing k, where m=1, 2 ... $2^N$ and N denoting the number of bits in the I and Q signals before thermometer encoding.

The gating/selection between the $LO_I$ and $LO'_I$ waveforms could be implemented by means of two parallel pass-gates, from which only one is active at any given time, depending on the sign of I. For positive values of I, $LO_I$ is selected, whereas for negative values $LO'_I$ is selected. In addition, if the $k^{th}$ bit $I_k$ of I is zero, both pass-gates are disabled and $OUT_k$ would be zero during the first and third quarters of the RF cycle. In such a case, $OUT_k$ would only have a contribution coming from the Q branch.

The same explanation holds for the outcome of the Q branch, and by means of wired logic between the I and Q branches their sum may be generated at $OUT_k$. In this example implementation, $T_p$ is chosen such that $T_p < T_c/4$ in order to prevent any contention between the two branches. Thus, as one of the pass-gates in the I branch allows a pulse through it, the pass-gates of the Q branch are disabled, and vice versa. This is insured by the timing of the pulses of the $LO_I$, $LO'_I$, $LO_Q$ and $LO'_Q$ waveforms as illustrated in FIG. 20.

A diagram illustrating waveforms of example outputs of the array for the modulator structure of FIG. 18 is shown in FIGS. 21A and 21B. FIG. 21A illustrates the output waveform from the transistor array 268 (FIG. 18) for the values I=3 and Q=5. Since both I and Q are positive, the $LO_I$ and $LO_Q$ $T_p$ pulses are passed by the multiplexers 272, 274 (FIG. 19) and gated to generate the input signal to the array. The AND gates effectively perform the multiplication by 3 and 5 and the result is applied to the appropriate weights of the transistor array.

FIG. 21B illustrates the output waveform from the transistor array 268 (FIG. 18) for the values I=3 and Q=−4. Since I is positive and Q is negative, the $LO_I$ and $LO'_Q$ $T_p$ pulses are passed by the multiplexers 272, 274 (FIG. 19) and gated to generate the input signal to the array. The AND gates effectively perform the multiplication by 3 and 4 (positive four since $LO'_Q$ clock signal is used and the sign bit of Q is separated from the magnitude word) and the result is applied to the appropriate weights of the transistor array. Note that a pulse of magnitude 4 now appears half a cycle (180 degrees) shifted from where the pulse of magnitude 5 appeared in the previous example, thus representing the shift from the first quadrant to the fourth one.

Figure 22:
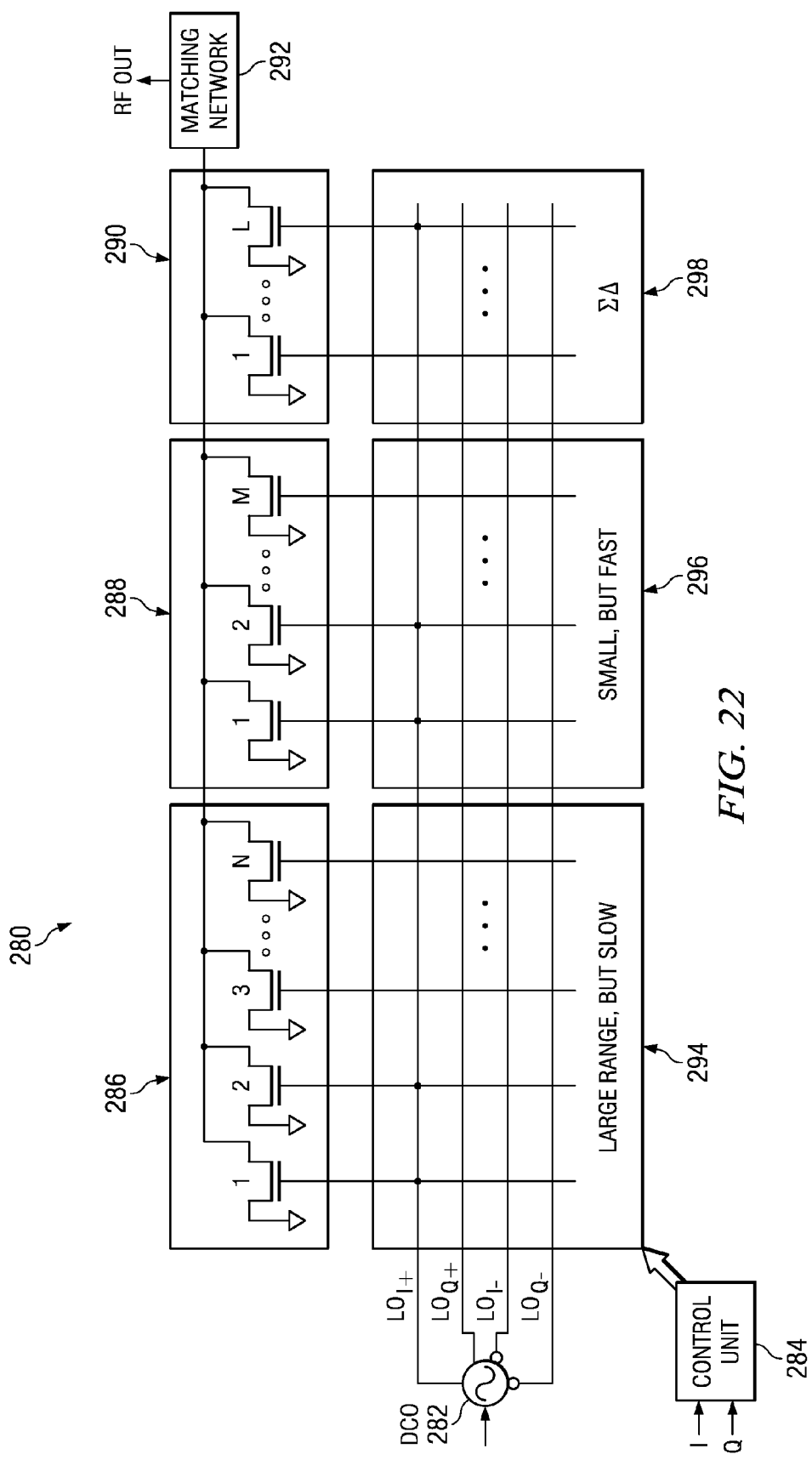
FIG. 22 is a block diagram illustrating the DQM with multiple transistor banks.

A block diagram illustrating the DQM with multiple transistor banks is shown in FIG. 22. In this alternative embodiment, the modulator circuit, generally referenced 280, comprises a DCO 282, digital control unit 284, a plurality of switch matrixes 294, 296, 298, a plurality of transistor arrays 286, 288, 290 and matching network 292. The switch matrix structure and transistor array are split into several parallel structures due to the fact that it is difficult to control large (e.g., N=1024) sizes at high speed. In the example embodiment described herein, the switch matrix structure and transistor array are split into three portions as follows: (1) a matrix and array comprising N transistors adapted to handle large dynamic range but low slowly varying signal, (2) a matrix and array comprising M transistors adapted to handle small dynamic range but quickly varying signal, and (3) a matrix and array comprising L transistors adapted to handle very small dynamic range but ultra fast varying signal. The underlying principle is that the modulating data is bandwidth limited. Consequently, a large range is needed for the slowly varying signal component and a fast varying signal component has a limited range. The ultra-fast component is not dictated directly by the data, but by other techniques, such that ΣΔ dithering to improve the resolution.

Figure 23:
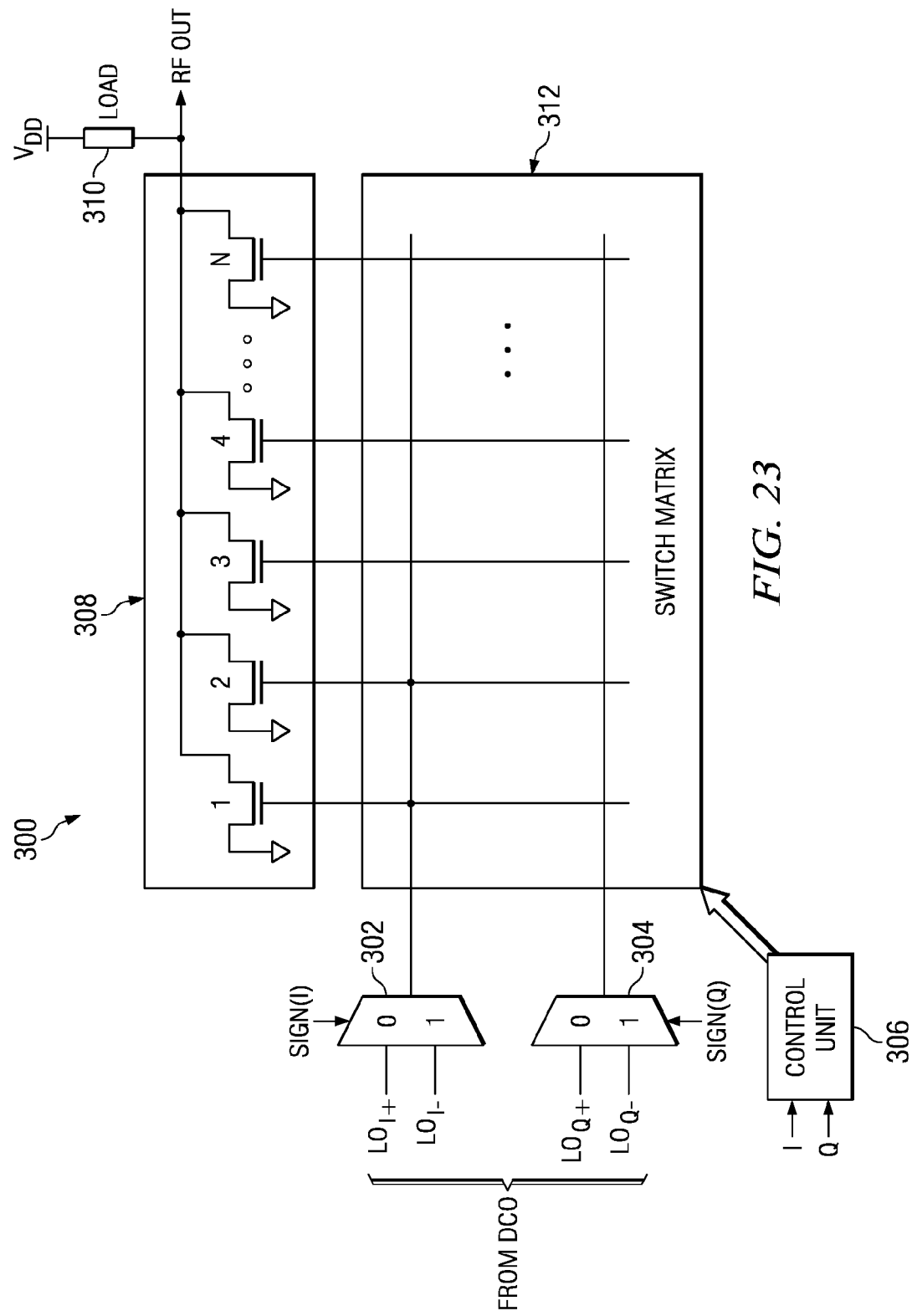
FIG. 23 is a block diagram illustrating the DQM incorporating a reduced complexity switch matrix.

A block diagram illustrating a DQM incorporating a reduced complexity switch matrix is shown in FIG. 23. In this alternative embodiment, the modulation circuit, generally referenced 300, comprises a pair of multiplexers 302, 204, control unit 306 adapted to receive I and Q signal inputs, switch matrix 312, transistor array 308 and load 310 which may be an RF choke, a resistive load, a current source with mirroring capability, etc. The reduced complexity switch matrix comprises only two rows for I and Q.

As described hereinabove, only namely $LO_{I+}$, $LO_{Q+}$, $LO_{I-}$, $LO_{Q-}$. $LO_{I+}$ or $LO_{I-}$ is normally used during a given time instance. Similarly, only $LO_{Q+}$ or $LO_{Q-}$ is selected during a given time instance. Consequently, it is possible to reduce the switch matrix complexity by performing the multiplex selection between the DCO and the switch matrix. Two control signals that determine the $LO_{I+}/LO_{I-}$ and $LO_{Q+}/LO_{Q-}$ selections are generated based on the I/Q quadrant location. In particular, an 'I' multiplexer 302 receives the $LO_{I+}$ and $LO_{I-}$ clock signals from the DCO wherein the select is controlled by the sign of I (quadrant dependent). A positive I steers the $LO_{I+}$ clock to the switch matrix while a negative I steers the $LO_{I-}$ clock. Similarly, a 'Q' multiplexer 304 receives the $LO_{Q+}$ and $LO_{Q-}$ clock signals from the DCO. The select is controlled by the sign of Q (quadrant dependent). A positive Q steers the $LO_{Q+}$ clock to the switch matrix while a negative Q steers $LO_{Q-}$ clock.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A digital complex modulator, comprising:
a first parallel array of switches adapted to be clocked by an In-phase (I) local oscillator clock signal gated with an I digital control word to generate a first current therefrom substantially proportional to said I digital control word;
a second parallel array of switches adapted to be clocked by a Quadrature (Q) local oscillator clock signal gated with a Q digital control word to generate a second current therefrom substantially proportional to said Q digital control word; and
means for summing said first current and said second current to yield a complex modulated output signal.

2. The modulator according to claim 1, wherein said first parallel array of switches and said second parallel array of switches each comprises an array of transistors.

3. The modulator according to claim 1, wherein said first parallel array of switches and said second parallel array of switches each comprises a differential array of transistors adapted to generate a differential signal.

4. The modulator according to claim 1, wherein said I local oscillator clock signal and said Q local oscillator clock signal are 90 degrees phase shifted from each other.

5. The modulator according to claim 1, wherein said I digital control signal comprises an in-phase component of a complex-envelope baseband signal and said Q digital control signal comprises a quadrature phase component of a complex-envelope baseband signal.

6. The modulator according to claim 1, further comprising a filter or matching network adapted to receive said output signal and generate a filtered RF output signal therefrom.

7. The modulator according to claim 1, wherein said complex modulated output signal is employed in a multi-mode or software defined radio adapted to operate in accordance with a communications standard selected from a plurality of communications standards supported by said radio.

8. The modulator according to claim 1, adapted to be implemented in an Application Specific Integrated Circuit (ASIC).

9. The modulator according to claim 1, adapted to be implemented in a Field Programmable Gate Array (FPGA).

10. A method of digital In-phase/Quadrature complex modulation, said method comprising the steps of:
providing an I switch array adapted to generate a first signal proportional to the number of switches active within said I switch array;
providing a Q switch array adapted to generate a second signal proportional to the number of switches active within said Q switch array;
applying a first gated combination of an I local oscillator clock signal and an I digital control word to said I switch array whereby the number of switches active in said I switch array is determined by said I control word;
applying a second gated combination of a Q local oscillator clock signal and a Q digital control word to said Q switch array whereby the number of switches active in said Q switch array is determined by said Q control word; and
summing said first signal and said second signal to yield a complex modulated output signal therefrom.

11. The method according to claim 10, wherein said I switch array and said Q switch array each comprises an array of transistors.

12. The method according to claim 10, wherein said I switch array and said Q switch array each comprises a differential array of transistors adapted to generate a differential signal.

13. The method according to claim 10, wherein said I local oscillator clock signal and said Q local oscillator clock signal are 90 degrees phase shifted from each other.

14. The method according to claim 10, wherein said I control signal and said Q control signal comprise in-phase and quadrature phase components of a complex-envelope baseband signal, respectively.

15. The method according to claim 10, further comprising the step of applying said output signal to a filter or matching network adapted to generate a filtered RF output signal therefrom.

16. The method according to claim 10, wherein said complex modulated output signal is employed in a multi-mode or software defined radio adapted to operate in accordance with a communications standard selected from a plurality of communications standards supported by said radio.

17. The method according to claim 10, adapted to be implemented in an Application Specific Integrated Circuit (ASIC).

18. The method according to claim 10, adapted to be implemented in a Field Programmable Gate Array (FPGA).

19. A digital quadrature modulator, comprising:
a local oscillator operative to generate quadrature phases;
a switch array comprising a plurality of switches adapted to generate a complex modulated output signal substantially proportional to the number of switches active at any one time in said array;
a switch matrix adapted to couple said quadrature phases output of said local oscillator to said switch array; and
control means coupled to said switch array, said control means operative to dynamically allocate a first portion of said switches to In-phase (I) output and a second portion to Quadrature (Q) output based on values of In-phase (I) and Quadrature (Q) input signals.

20. The modulator according to claim 19, wherein said plurality of switches comprises a plurality of transistors.

21. The modulator according to claim 19, wherein said switch matrix further comprises a plurality of attenuators, each attenuator adapted to be coupled to a switch in said switch array when none of said quadrature phases are selected to be coupled thereto.

22. The modulator according to claim 19, wherein said complex modulated output signal is employed in a multi-mode or software defined radio adapted to operate in accordance with a communications standard selected from a plurality of communications standards supported by said radio.

23. The modulator according to claim 19, adapted to be implemented in an Application Specific Integrated Circuit (ASIC).

24. The modulator according to claim 19, adapted to be implemented in a Field Programmable Gate Array (FPGA).

25. A digital quadrature modulator, comprising:
oscillator means for generating a local oscillator In phase (I) ($LO_I$) signal, an inverted $\overline{LO_I}$ signal, a Quadrature (Q) ($LO_Q$) signal, and an inverted $\overline{LO_Q}$ signal;
an In phase (I) switch array comprising a plurality of first switches adapted to generate an In phase (I) output signal substantially proportional to a number of first switches active at any one time, wherein the number of first switches active in synchronization with the $LO_I$ or $\overline{LO_I}$ signal is determined by a magnitude of an In phase (I) digital input signal;

a Quadrature (Q) switch array comprising a plurality of second switches adapted to generate a Q output signal substantially proportional to the number of second switches active at any one time, wherein the number of second switches active in synchronization with the $LO_Q$ or $\overline{LO_Q}$ signal is determined by a magnitude of a Quadrature (Q) digital input signal;

first means adapted to couple either said $LO_I$ signal or said $\overline{LO_I}$ signal to said In phase (I) switch array in accordance with a sign of said In phase (I) input signal;

second means adapted to couple either said $LO_Q$ signal or said $\overline{LO_Q}$ signal to said Quadrature (Q) switch array in accordance with a sign of said Quadrature (Q) input signal; and means for summing said In phase (I) output signal and said Quadrature (Q) output signal to generate a quadrature modulated output therefrom.

26. The modulator according to claim 25, wherein said plurality of first switches and said plurality of second switches each comprises a plurality of transistors.

27. The modulator according to claim 25, wherein said I switch array and said Q switch array each comprises a separate plurality of unit-weighted transistors adapted to receive a thermometer coded digital input signal.

28. The modulator according to claim 25, wherein said I switch array and said Q switch array each comprises a separate plurality of binary-weighted transistors adapted to receive a naturally encoded digital input signal.

29. The modulator according to claim 25, wherein said quadrature modulated output is employed in a multi-mode or software defined radio adapted to operate in accordance with a communications standard selected from a plurality of communications standards supported by said radio.

30. The modulator according to claim 25, adapted to be implemented in an Application Specific Integrated Circuit (ASIC).

31. The modulator according to claim 25, adapted to be implemented in a Field Programmable Gate Array (FPGA).

32. A digital quadrature modulator, comprising:
oscillator means for generating a first local oscillator signal $LO_I$, a second local oscillator signal $LO'_I$, a third local oscillator signal $LO_Q$, and fourth local oscillator signal $LO'_Q$;

a switch array comprising a plurality of switches adapted to be shared between In phase (I) and Quadrature (Q) digitally control branches, said switch array operative to generate a quadrature modulated output signal substantially proportional to a number of switches instantaneously active in accordance with combined In phase (I) and Quadrature (Q) input digital signals and said local oscillator signals;

first means for generating an In phase (I) contribution in accordance with an In phase (I) input signal and an In phase (I) local oscillator signal;

second means for generating a Quadrature (Q) contribution in accordance with an In phase (I) input signal and an In phase (I) local oscillator signal; and third means for time multiplexing said In phase (I) contribution and said Quadrature (Q) contribution to yield said combined In phase (I) and Quadrature (Q) signal to produce said quadrature modulated output.

33. The modulator according to claim 32, wherein said first means comprises:
fourth means adapted to couple either said $LO_I$ signal or said $LO'_I$ signal to a first plurality of gates in accordance with a sign of said I input signal; and said first plurality of gates adapted to gate said I input signal with said $LO_I$ signal or said $LO'_I$ to generate said I contribution therefrom.

34. The modulator according to claim 32, wherein said second means comprises:
fourth means adapted to couple either said $LO_Q$ signal or said $LO'_Q$, signal to a first plurality of gates in accordance with a sign of said Q input signal; and said first plurality of gates adapted to gate said Q input signal with said $LO_Q$ signal or said $LO'_Q$, signal to generate said Q contribution therefrom.

35. The modulator according to claim 32, wherein said plurality of switches comprises a plurality of transistors.

36. The modulator according to claim 32, wherein said switch array comprises a plurality of unit-weighted transistors adapted to receive a thermometer coded combined I and Q signal.

37. The modulator according to claim 32, wherein said switch array comprises a plurality of binary-weighted transistors adapted to receive a naturally encoded combined I and Q signal.

38. The modulator according to claim 32, wherein said quadrature modulated output is employed in a multi-mode or software defined radio adapted to operate in accordance with a communications standard selected from a plurality of communications standards supported by said radio.

* * * * *